(12) United States Patent
Nakagawa et al.

(10) Patent No.: US 12,250,017 B2
(45) Date of Patent: Mar. 11, 2025

(54) RADIO FREQUENCY MODULE AND COMMUNICATION DEVICE

(71) Applicant: Murata Manufacturing Co., Ltd., Kyoto (JP)

(72) Inventors: Dai Nakagawa, Kyoto (JP); Takanori Uejima, Kyoto (JP); Yuji Takematsu, Kyoto (JP); Naoya Matsumoto, Kyoto (JP); Ryohei Okabe, Kyoto (JP); Hiromichi Kitajima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 363 days.

(21) Appl. No.: 17/930,834

(22) Filed: Sep. 9, 2022

(65) Prior Publication Data

US 2023/0006708 A1 Jan. 5, 2023

Related U.S. Application Data

(63) Continuation of application No. PCT/JP2021/006888, filed on Feb. 24, 2021.

(30) Foreign Application Priority Data

Apr. 24, 2020 (JP) ................................ 2020-077821

(51) Int. Cl.
*H04B 1/40* (2015.01)

(52) U.S. Cl.
CPC ...................... *H04B 1/40* (2013.01)

(58) Field of Classification Search
CPC ...................................................... H04B 1/40
See application file for complete search history.

(56) References Cited

U.S. PATENT DOCUMENTS

2005/0139981 A1* 6/2005 Kobayashi .......... H01L 23/5227
   257/E23.021
2005/0212106 A1* 9/2005 Kwon ..................... H01L 23/66
   257/E25.031

(Continued)

FOREIGN PATENT DOCUMENTS

JP   H06-151960 A   5/1994
JP   H10-125830 A   5/1998

(Continued)

OTHER PUBLICATIONS

International Search Report for PCT/JP2021/006888 dated May 25, 2021.

*Primary Examiner* — David Bilodeau
(74) *Attorney, Agent, or Firm* — MCDONALD HOPKINS LLC

(57) ABSTRACT

A radio frequency module includes a mounting substrate, a first electronic component, a second electronic component, a resin layer, and a shield layer. The resin layer covers outer peripheral surfaces of the first electronic component and the second electronic component. The first electronic component includes a first substrate having first and second main surfaces opposed to each other, and a first circuit section formed on the first main surface side of the first substrate. The second electronic component includes a second substrate having first and second main surfaces opposed to each other, and a second circuit section formed on the first main surface side of the second substrate. A material of the first substrate and a material of the second substrate are the same. The shield layer is in contact with the second main surface of the first substrate and the second main surface of the second substrate.

20 Claims, 19 Drawing Sheets

(56) References Cited

U.S. PATENT DOCUMENTS

| | | | |
|---|---|---|---|
| 2017/0250669 A1* | 8/2017 | Kuroyanagi | H03H 9/02574 |
| 2018/0351595 A1* | 12/2018 | Tarui | H04B 1/38 |
| 2020/0203291 A1* | 6/2020 | Uejima | H01L 25/16 |
| 2020/0365771 A1 | 11/2020 | Hiroki et al. | |
| 2020/0395262 A1* | 12/2020 | Nomura | H01L 23/552 |
| 2021/0005579 A1 | 1/2021 | Matsumoto | |

FOREIGN PATENT DOCUMENTS

| | | |
|---|---|---|
| JP | 2017-157922 A | 9/2017 |
| WO | 2019/150825 A1 | 8/2019 |
| WO | 2019/181590 A1 | 9/2019 |
| WO | 2019/181761 A1 | 9/2019 |

* cited by examiner

RADIO FREQUENCY MODULE AND COMMUNICATION DEVICE

CROSS REFERENCE TO RELATED APPLICATION

This is a continuation of International Application No. PCT/JP2021/006888 filed on Feb. 24, 2021 which claims priority from Japanese Patent Application No. 2020-077821 filed on Apr. 24, 2020. The contents of these applications are incorporated herein by reference in their entireties.

BACKGROUND OF THE DISCLOSURE

Field of the Disclosure

The present disclosure generally relates to a radio frequency module and a communication device, and more particularly, relates to a radio frequency module including a mounting substrate and a communication device including the radio frequency module.

Description of the Related Art

Patent Document 1 discloses a radio frequency module including a mounting substrate having a first main surface and a second main surface that are opposed to each other, a transmission power amplifier mounted on the first main surface of the mounting substrate, a transmission filter and a reception filter that are mounted on the first main surface of the mounting substrate, a resin member (resin layer) covering the transmission power amplifier, the transmission filter, and the reception filter, and a shield electrode layer (shield layer).

In the radio frequency module disclosed in Patent Document 1, the shield electrode layer is formed so as to cover a top surface and a side surface of the resin member.

Additionally, Patent Document 1 discloses a communication device including a radio frequency module.
Patent Document 1: International Publication No. 2019/181590

BRIEF SUMMARY OF THE DISCLOSURE

In a radio frequency module, improvement in heat dissipation may be required in order to suppress an increase in temperature of an electronic component.

A possible benefit of the present disclosure is to provide a radio frequency module and a communication device that are capable of improving the heat dissipation.

A radio frequency module according to an aspect of the present disclosure includes a mounting substrate, a first electronic component and a second electronic component, a resin layer, and a shield layer. The mounting substrate has a first main surface and a second main surface that are opposed to each other. The first electronic component and the second electronic component are disposed over the first main surface of the mounting substrate. The resin layer is disposed on the first main surface of the mounting substrate and covers an outer peripheral surface of the first electronic component and an outer peripheral surface of the second electronic component. The shield layer covers the resin layer, the first electronic component, and the second electronic component. The first electronic component includes a first substrate having a first main surface and a second main surface that are opposed to each other, and a first circuit section formed on the first main surface side of the first substrate. The second electronic component includes a second substrate having a first main surface and a second main surface that are opposed to each other, and a second circuit section formed on the first main surface side of the second substrate. A material of the first substrate and a material of the second substrate are the same. The shield layer is in contact with the second main surface of the first substrate and the second main surface of the second substrate.

A communication device according to an aspect of the present disclosure includes the radio frequency module described above and a signal processing circuit. The signal processing circuit is connected to the radio frequency module and performs signal processing on a radio frequency signal.

The radio frequency module and the communication device according to the above-described aspects of the present disclosure can improve the heat dissipation.

DETAILED DESCRIPTION OF THE DISCLOSURE

FIGS. 1 to 3 and 5 to 19, which will be referred to in the following embodiments and the like, are schematic views, and ratios of sizes and thicknesses of respective constituent elements in the figures do not necessarily reflect actual dimensional ratios.

Embodiment 1

Figure 1:
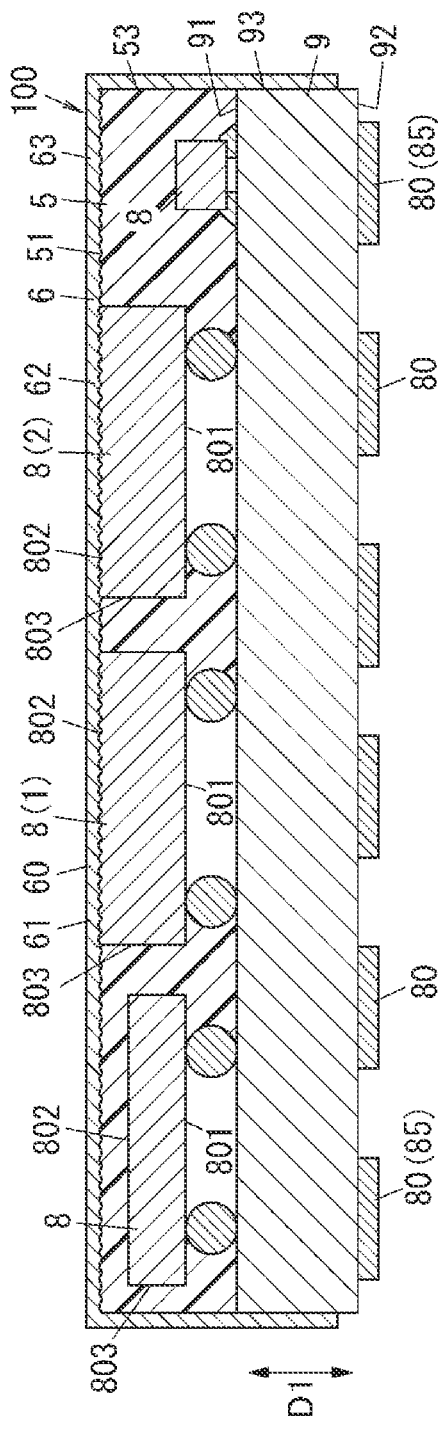
FIG. 1 is a cross-sectional view of a radio frequency module according to Embodiment 1.
Figure 2:
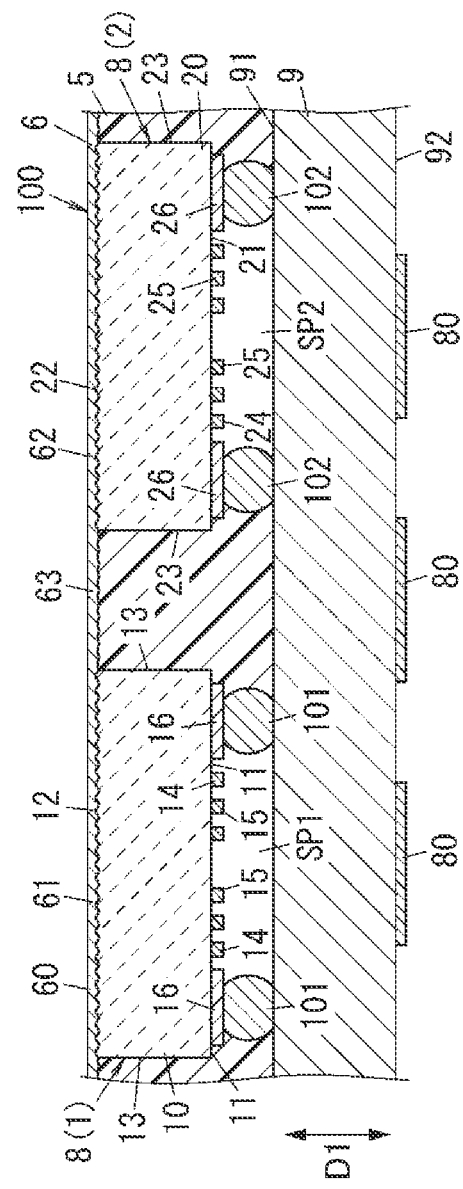
FIG. 2 is an enlarged cross-sectional view of a part of the above-described radio frequency module.
Figure 3:
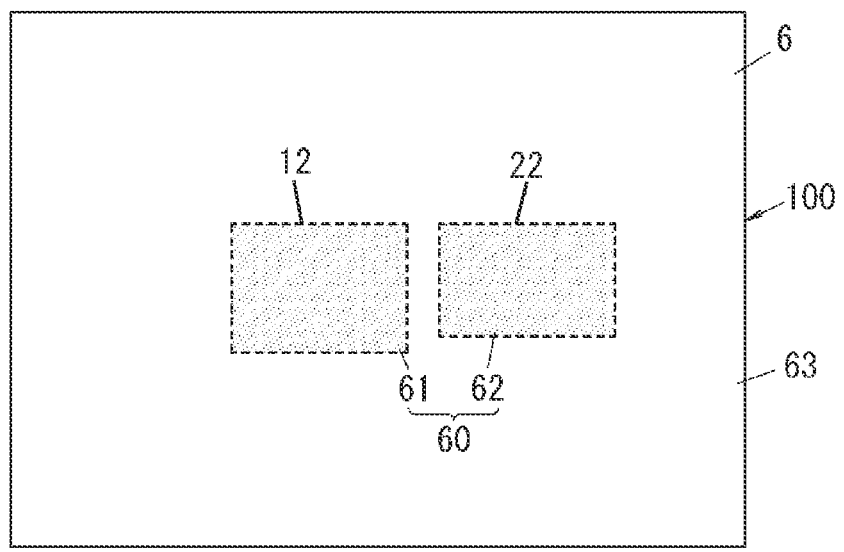
FIG. 3 is a plan view of the above-described radio frequency module.

For example, as illustrated in FIGS. 1 to 3, a radio frequency module 100 according to Embodiment 1 includes a mounting substrate 9, a first electronic component 1 and a second electronic component 2, a resin layer 5, and a shield layer 6. The mounting substrate 9 has a first main surface 91 and a second main surface 92 that are opposed to each other. The first electronic component 1 and the second electronic component 2 are disposed over the first main surface 91 of the mounting substrate 9. The resin layer 5 is disposed on the first main surface 91 of the mounting substrate 9, and covers an outer peripheral surface 13 (see FIG. 2) of the first electronic component 1 and an outer peripheral surface 23 (see FIG. 2) of the second electronic component 2. The shield layer 6 covers the resin layer 5, and the first electronic component 1 and the second electronic component 2. The first electronic component 1 includes a first substrate 10 having a first main surface 11 and a second main surface 12 that are opposed to each other, and a first circuit section 14 formed on the first main surface 11 side of the first substrate 10. The second electronic component 2 includes a second substrate 20 having a first main surface 21 and a second main surface 22 that are opposed to each other, and a second circuit section 24 formed on the first main surface 21 side of the second substrate 20. A material of the first substrate 10 and a material of the second substrate 20 are the same. The shield layer 6 is in contact with the second main surface 12 of the first substrate 10 and the second main surface 22 of the second substrate 20. The radio frequency module 100 according to Embodiment 1 can improve the heat dissipation.

Hereinafter, the radio frequency module 100 and a communication device 300 according to Embodiment 1 will be described in more detail with reference to FIG. 4.

(1) Radio Frequency Module and Communication Device
(1.1) Circuit Configuration of Radio Frequency Module and Communication Device The radio frequency module 100 is used in, for example, the communication device 300. The communication device 300 is, for example, a mobile phone (for example, a smartphone), but is not limited thereto, and may be, for example, a wearable terminal (for example, a smartwatch) or the like. The radio frequency module 100 is a module being compatible with, for example, the Fourth Generation (4G) mobile communication standard, the Fifth Generation (5G) mobile communication standard, or the like. The 4G standard is, for example, the Third Generation Partnership Project (3GPP) Long Term Evolution (LTE) standard. The 5G standard is, for example, the 5G New Radio (NR). The radio frequency module 100 is, for example, a module capable of supporting carrier aggregation and dual connectivity.

For example, the radio frequency module 100 is configured to amplify a transmission signal (radio frequency signal) inputted from a signal processing circuit 301 and to output the amplified transmission signal to an antenna 310. The radio frequency module 100 is configured to amplify a reception signal (radio frequency signal) inputted from the antenna 310 and to output the amplified reception signal to the signal processing circuit 301. The signal processing circuit 301 is not a constituent element of the radio frequency module 100 but a constituent element of the communication device 300 including the radio frequency module 100. The radio frequency module 100 is controlled by, for example, the signal processing circuit 301 included in the communication device 300. The communication device 300 includes the radio frequency module 100 and the signal processing circuit 301. The communication device 300 further includes the antenna 310. The communication device 300 further includes a circuit board mounted with the radio frequency module 100. The circuit board is, for example, a printed wiring board. The circuit board includes a ground electrode to which a ground potential is applied.

The signal processing circuit 301 includes, for example, an RF signal processing circuit 302 and a baseband signal processing circuit 303. The RF signal processing circuit 302 is, for example, a Radio Frequency Integrated Circuit (RFIC), and performs signal processing on a radio frequency signal. For example, the RF signal processing circuit 302 performs signal processing such as up-conversion on a radio frequency signal (transmission signal) outputted from the baseband signal processing circuit 303, and outputs the radio frequency signal on which the signal processing has been performed. In addition, for example, the RF signal processing circuit 302 performs signal processing such as down-conversion on a radio frequency signal (reception signal) outputted from the radio frequency module 100, and outputs the radio frequency signal, on which the signal processing has been performed, to the baseband signal processing circuit 303. The baseband signal processing circuit 303 is, for example, a BaseBand Integrated Circuit (BBIC). The baseband signal processing circuit 303 generates an I-phase signal and a Q-phase signal from a baseband signal. The baseband signal is, for example, an audio signal, an image signal, or the like inputted from the outside. The baseband signal processing circuit 303 performs IQ modulation processing by combining the I-phase signal and the Q-phase signal, and then, outputs a transmission signal. At this time, the transmission signal is generated as modulation signals (IQ signal) obtained by amplitude-modulating a carrier signal having a predetermined frequency at a period longer than the period of the carrier signal. A reception signal processed by the baseband signal processing circuit 303 is used, for example, as an image signal for image display or as an audio signal for telephone speech. The radio frequency module 100 transmits a radio frequency signal (reception signal, transmission signal) between the antenna 310 and the RF signal processing circuit 302 of the signal processing circuit 301.

The radio frequency module 100 includes a power amplifier 111 and a low-noise amplifier 121. Additionally, the radio frequency module 100 includes a plurality of (for example, two) transmission filters 112A and 112B and a plurality of (for example, two) reception filters 122A and 122B. The radio frequency module 100 further includes an output matching circuit 113 and an input matching circuit 123. The radio frequency module 100 further includes a first switch 104, a second switch 105, and a third switch 106. The radio frequency module 100 further includes a controller 115. In the radio frequency module 100 according to Embodiment 1, the transmission filter 112B constitutes the above-described first electronic component 1 (see FIG. 2). In addition, in the radio frequency module 100 according to Embodiment 1, the reception filter 122B constitutes the second electronic component 2 described above.

The radio frequency module 100 also includes a plurality of external connection terminals 80. The plurality of external connection terminals 80 include an antenna terminal 81, a signal input terminal 82, a signal output terminal 83, a control terminal 84, and a plurality of ground terminals 85 (see FIG. 1). The plurality of ground terminals 85 are terminals to which a ground potential is applied by being electrically connected to a ground electrode of the above-described circuit board included in the communication device 300.

The power amplifier 111 includes an input terminal and an output terminal. The power amplifier 111 amplifies a transmission signal in a first frequency band input to the input terminal and outputs the amplified transmission signal from the output terminal. Here, the first frequency band includes, for example, a first communication band and a second communication band. The first communication band corresponds to a transmission signal passing through the transmission filter 112A, and is, for example, Band11 of the 3GPP LTE standard. The second communication band corresponds to a transmission signal passing through the transmission filter 112B, and is, for example, Band22 of the 3GPP LTE standard. The input terminal of the power amplifier 111 is connected to the signal input terminal 82. The input terminal of the power amplifier 111 is connected to the signal processing circuit 301 via the signal input terminal 82. The signal input terminal 82 is a terminal for inputting a radio frequency signal (transmission signal) from an external circuit (for example, the signal processing circuit 301) to the radio frequency module 100. The output terminal of the power amplifier 111 is connected to a common terminal 150 of the second switch 105 via the output matching circuit 113.

The low-noise amplifier 121 has an input terminal and an output terminal. The low-noise amplifier 121 amplifies a reception signal in a second frequency band inputted to the input terminal and outputs the amplified reception signal from the output terminal. The second frequency band is, for example, the same as the first frequency band, and includes the first communication band and the second communication band. The input terminal of the low-noise amplifier 121 is connected to a common terminal 160 of the third switch 106 via the input matching circuit 123. The output terminal of the low-noise amplifier 121 is connected to the signal output terminal 83. The output terminal of the low-noise amplifier 121 is connected to the signal processing circuit 301 via, for example, the signal output terminal 83. The signal output terminal 83 is a terminal for outputting a radio frequency signal (reception signal) from the low-noise amplifier 121 to an external circuit (for example, the signal processing circuit 301).

The transmission filter 112A is, for example, a filter whose pass band is a transmission band of the first communication band. The transmission filter 112B is, for example, a filter whose pass band is a transmission band of the second communication band. The reception filter 122A is, for example, a filter whose pass band is the reception band of the first communication band. The reception filter 122B is, for example, a filter whose pass band is the reception band of the second communication band. In the radio frequency module 100 according to Embodiment 1, the transmission filter 112A and the reception filter 122A constitute a duplexer 132A. Also, in the radio frequency module 100 according to Embodiment 1, the transmission filter 112B and the reception filter 122B constitute a duplexer 132B.

The first switch 104 includes a common terminal 140 and a plurality of (for example, two) selection terminals 141 and 142. The common terminal 140 is connected to the antenna terminal 81. The antenna 310 is connected to the antenna terminal 81. The selection terminal 141 is connected to a connection point between an output terminal of the transmission filter 112A and an input terminal of the reception filter 122A. The selection terminal 142 is connected to a connection point between an output terminal of the transmission filter 112B and an input terminal of the reception filter 122B. The first switch 104 is, for example, a switch capable of connecting at least one or more selection terminals among the plurality of selection terminals 141 and 142 to the common terminal 140. Here, the first switch 104 is, for example, a switch capable of one-to-one connection and one-to-many connection.

The first switch 104 is controlled by, for example, the signal processing circuit 301. The first switch 104 switches a connection state between the common terminal 140 and the plurality of selection terminals 141 and 142 in accordance with a control signal from the RF signal processing circuit 302 of the signal processing circuit 301. The first switch 104 is, for example, a switch Integrated Circuit (IC).

The second switch 105 includes a common terminal 150 and a plurality of (for example, two) selection terminals 151 and 152. The common terminal 150 is connected to the output terminal of the power amplifier 111 via the output matching circuit 113. The selection terminal 151 is connected to an input terminal of the transmission filter 112A. The selection terminal 152 is connected to an input terminal of the transmission filter 112B. The second switch 105 is, for example, a switch capable of connecting at least one or more selection terminals among the plurality of selection terminals 151 and 152 to the common terminal 150. Here, the second switch 105 is, for example, a switch capable of one-to-one connection and one-to-many connection.

The second switch 105 is controlled by, for example, the signal processing circuit 301. The second switch 105 switches a connection state between the common terminal 150 and the plurality of selection terminals 151 and 152 in accordance with a control signal from the RF signal processing circuit 302 of the signal processing circuit 301. The second switch 105 is, for example, a switch IC.

The third switch 106 includes a common terminal 160 and a plurality of (for example, two) selection terminals 161 and 162. The common terminal 160 is connected to the input terminal of the low-noise amplifier 121 via the input matching circuit 123. The selection terminal 161 is connected to an output terminal of the reception filter 122A. The selection terminal 162 is connected to an output terminal of the reception filter 122B. The third switch 106 is, for example, a switch capable of connecting at least one or more selection terminals among the plurality of selection terminals 161 and 162 to the common terminal 160. Here, the third switch 106 is, for example, a switch capable of one-to-one connection and one-to-many connection.

The third switch 106 is controlled by, for example, the signal processing circuit 301. The third switch 106 switches a connection state between the common terminal 160 and the plurality of selection terminals 161 and 162 in accordance with a control signal from the RF signal processing circuit 302 of the signal processing circuit 301. The third switch 106 is, for example, a switch IC.

The output matching circuit 113 is provided in a signal path between the output terminal of the power amplifier 111 and the common terminal 150 of the second switch 105. The output matching circuit 113 is a circuit for impedance matching between the power amplifier 111 and the transmission filters 112A and 112B. The output matching circuit 113 is constituted by, for example, one inductor, but is not limited to this, and may include, for example, a plurality of inductors and a plurality of capacitors.

The input matching circuit 123 is provided in a signal path between the input terminal of the low-noise amplifier 121 and the common terminal 160 of the third switch 106. The input matching circuit 123 is a circuit for impedance matching between the low-noise amplifier 121 and the reception filters 122A and 122B. The input matching circuit 123 includes, for example, one inductor, but is not limited to this, and may include, for example, a plurality of inductors and a plurality of capacitors.

The controller 115 is connected to the control terminal 84. The controller 115 is connected to the signal processing circuit 301 via the control terminal 84. The control terminal 84 is a terminal for inputting a control signal from an external circuit (for example, the signal processing circuit 301) to the radio frequency module 100. The controller 115 is connected to the power amplifier 111, and controls the power amplifier 111 based on a control signal from the signal processing circuit 301.

(1.2) Structure of Radio Frequency Module

As illustrated in FIG. 2, the radio frequency module 100 includes the mounting substrate 9, a plurality of electronic components 8, and a plurality of external connection terminals 80. The plurality of electronic components 8 include the power amplifier 111, the low-noise amplifier 121, the two transmission filters 112A and 112B, the two reception filters 122A and 122B, the inductor of the output matching circuit 113, and the inductor of the input matching circuit 123, which have been described above. That is, the plurality of electronic components 8 include the transmission filter 112B that is the first electronic component 1 described above and the reception filter 122B that is the second electronic component 2 described above. Here, the first electronic component 1 is the transmission filter 112B of the duplexer 132B having the narrowest interval between the transmission band and the reception band among the plurality of duplexers 132A and 132B. Also, the second electronic component 2 is the reception filter 122B of the duplexer 132B having the narrowest interval between the transmission band and the reception band among the plurality of duplexers 132A and 132B. The plurality of electronic components 8 further include the first switch 104, the second switch 105, and the third switch 106, which have been described above.

The mounting substrate 9 has the first main surface 91 and the second main surface 92 that are opposed to each other in a thickness direction D1 of the mounting substrate 9. The mounting substrate 9 is, for example, a multilayer substrate including a plurality of dielectric layers and a plurality of conductive layers. The plurality of dielectric layers and the plurality of conductive layers are laminated in the thickness direction D1 of the mounting substrate 9. The plurality of conductive layers are formed in a predetermined pattern determined for each layer. Each of the plurality of conductive layers includes one or a plurality of conductors in one plane orthogonal to the thickness direction D1 of the mounting substrate 9. A material of each conductive layer is, for example, copper. The plurality of conductive layers include a ground layer. In the radio frequency module 100, the plurality of ground terminals 85 and the ground layer are electrically connected to each other through via conductors or the like included in the mounting substrate 9. The mounting substrate 9 is, for example, a Low Temperature Co-fired Ceramics (LTCC) substrate. The mounting substrate 9 is not limited to the LTCC substrate and may be, for example, a printed wiring board, a High Temperature Co-fired Ceramics (HTCC) substrate, or a resin multilayer substrate.

Further, the mounting substrate 9 is not limited to the LTCC substrate and may be, for example, a wiring structure. The wiring structure is, for example, a multilayer structure. The multilayer structure includes at least one insulating layer and at least one conductive layer. The insulating layer is formed in a predetermined pattern. When there are a plurality of insulating layers, the plurality of insulating layers are formed in a predetermined pattern determined for each layer. The conductive layer is formed in a predetermined pattern different from the predetermined pattern of the insulating layer. When there are a plurality of conductive layers, the plurality of conductive layers are formed in a predetermined pattern determined for each layer. The conductive layer may include one or a plurality of rewiring portions. In the wiring structure, of two surfaces that are opposed to each other in a thickness direction of the multilayer structure, the first surface is the first main surface 91 of the mounting substrate 9, and the second surface is the second main surface 92 of the mounting substrate 9. The wiring structure may be, for example, an interposer. The interposer may be an interposer using a silicon substrate, or may be a substrate constituted by multiple layers.

The first main surface 91 and the second main surface 92 of the mounting substrate 9 are separated from each other in the thickness direction D1 of the mounting substrate 9, and intersect each other in the thickness direction D1 of the mounting substrate 9. The first main surface 91 of the mounting substrate 9 is orthogonal to the thickness direction D1 of the mounting substrate 9, for example, but may include a side surface of a conductor or the like as a surface that is not orthogonal to the thickness direction D1, for example. Further, the second main surface 92 of the mounting substrate 9 is orthogonal to the thickness direction D1 of the mounting substrate 9, for example, but may include a side surface of a conductor or the like as a surface that is not orthogonal to the thickness direction D1, for example. Further, the first main surface 91 and the second main surface 92 of the mounting substrate 9 may have fine irregularities, or concave portions or convex portions.

The plurality of electronic components 8 of the radio frequency module 100 according to Embodiment 1 are mounted on the first main surface 91 of the mounting substrate 9. Here, the term "mounted" includes that the electronic component 8 is disposed over (mechanically connected to) the first main surface 91 of the mounting substrate 9 and that the electronic component 8 is electrically connected to (an appropriate conductor of) the mounting substrate 9. Thus, in the radio frequency module 100, the plurality of electronic components 8 are disposed over the first main surface 91 of the mounting substrate 9. Each of the plurality of electronic components 8 has a first main surface 801 and a second main surface 802 that are opposed to each other, and is disposed over the first main surface 91 of the mounting substrate 9 such that the first main surface 801 of the electronic component 8 is positioned on the first main surface 91 side of the mounting substrate 9 in the thickness direction D1 of the mounting substrate 9. Thus, the second main surface 802 of the electronic component 8 constitutes a main surface positioned on the opposite side to the mounting substrate 9 side in the thickness direction D1 of the mounting substrate 9. Further, each of the plurality of electronic components 8 has an outer peripheral surface 803 connecting the first main surface 801 and the second main surface 802. The outer peripheral surface 803 of the electronic component 8 includes four side surfaces connecting the first main surface 801 and the second main surface 802 in the electronic component 8, and does not include the first main surface 801 and the second main surface 802. The radio frequency module 100 may include not only the plurality of electronic components 8 mounted on the mounting substrate 9 but also circuit elements provided in the mounting substrate 9.

In the radio frequency module 100, the power amplifier 111 is an IC chip including a substrate having a first main surface and a second main surface that are opposed to each other, and a circuit section (IC section) including a transistor formed on the first main surface side of the substrate. The substrate is, for example, a gallium arsenide substrate. The circuit section has a function of amplifying a transmission signal inputted to the input terminal of the power amplifier 111. The transistor is, for example, a Heterojunction Bipolar Transistor (HBT). The power amplifier 111 may include, for example, a capacitor for cutting a direct current. An IC chip including the power amplifier 111 is flip-chip mounted on the first main surface 91 of the mounting substrate 9 such that the first main surface, among the first main surface and the second main surface of the substrate, is positioned on the first main surface 91 side of the mounting substrate 9. In a plan view from the thickness direction D1 of the mounting substrate 9, an outer peripheral shape of the IC chip including the power amplifier 111 is a quadrangular shape. The substrate in the IC chip including the power amplifier 111 is not limited to the gallium arsenide substrate, and may be a silicon substrate, a silicon germanium substrate, a gallium nitride substrate, or the like. Also, the transistor is not limited to a bipolar transistor such as an HBT, and may be, for example, a Field Effect Transistor (FET). The FET is, for example, a Metal-Oxide-Semiconductor Field Effect Transistor (MOSFET).

The low-noise amplifier 121 is, for example, an IC chip including a substrate having a first main surface and a second main surface that are opposed to each other and a circuit section (IC section) formed on the first main surface side of the substrate. The substrate is, for example, a silicon substrate. The circuit section has a function of amplifying a reception signal inputted to the input terminal of the low-noise amplifier 121. The low-noise amplifier 121 is flip-chip mounted on the first main surface 91 of the mounting substrate 9 such that the first main surface, among the first main surface and the second main surface of the substrate, is positioned on the first main surface 91 side of the mounting substrate 9. In a plan view from the thickness direction D1 of the mounting substrate 9, an outer peripheral shape of the low-noise amplifier 121 is a quadrangular shape.

Each of the two transmission filters 112A and 112B and the two reception filters 122A and 122B is, for example, a ladder filter, and includes a plurality of (for example, four) series-arm resonators and a plurality of (for example, three) parallel-arm resonators. Each of the two transmission filters 112A and 112B and the two reception filters 122A and 122B is, for example, an acoustic wave filter. In the acoustic wave filter, each of the plurality of series-arm resonators and the plurality of parallel-arm resonators is constituted by an acoustic wave resonator. The acoustic wave filter is, for example, a surface acoustic wave filter using a surface acoustic wave.

In the surface acoustic wave filter, each of the plurality of series-arm resonators and the plurality of parallel-arm resonators is a Surface Acoustic Wave (SAW) resonator, for example.

The surface acoustic wave filter includes, for example, a substrate having a first main surface and a second main surface that are opposed to each other, and a circuit section formed on the first main surface side of the substrate. The substrate is a piezoelectric substrate. The piezoelectric substrate is, for example, a lithium niobate substrate. The circuit section includes a plurality of InterDigital Transducer (IDT) electrodes corresponding one-to-one to the plurality of series-arm resonators, and a plurality of IDT electrodes corresponding one-to-one to the plurality of parallel-arm resonators.

Each of the two transmission filters 112A and 112B and the two reception filters 122A and 122B is, for example, an acoustic wave filter of a bare chip. In a plan view from the thickness direction D1 of the mounting substrate 9, the outer peripheral shape of each of the two transmission filters 112A and 112B and the two reception filters 122A and 122B is a quadrangular shape.

Each of the two transmission filters 112A and 112B and the two reception filters 122A and 122B is flip-chip mounted on the first main surface 91 of the mounting substrate 9 such that the first main surface, among the first main surface and the second main surface of the substrate, is positioned on the mounting substrate 9 side.

Each of the first switch 104, the second switch 105, and the third switch 106 is a switch IC. More specifically, each of the first switch 104, the second switch 105, and the third switch 106 is, for example, an IC chip including a substrate having a first main surface and a second main surface that are opposed to each other, and a circuit section (IC section) including a Field Effect Transistor (FET) formed on the first main surface side of the substrate. The substrate is, for example, a silicon substrate. The circuit section is a functional section having a function of switching a connection state between the common terminal and the plurality of selection terminals. Each of the first switch 104, the second switch 105, and the third switch 106 is flip-chip mounted on the first main surface 91 of the mounting substrate 9 such that the first main surface, among the first main surface and the second main surface of the substrate, is positioned on the first main surface 91 side of the mounting substrate 9. In a plan view from the thickness direction D1 of the mounting substrate 9, the outer peripheral shape of an IC chip constituting each of the first switch 104, the second switch 105, and the third switch 106 is a quadrangular shape.

The inductor in the output matching circuit 113 is, for example, a chip inductor. The inductor in the output matching circuit 113 is mounted on, for example, the first main surface 91 of the mounting substrate 9, but is not limited thereto. In a plan view from the thickness direction D1 of the mounting substrate 9, the outer peripheral shape of the inductor is a quadrangular shape.

The inductor in the input matching circuit 123 is, for example, a chip inductor. The inductor in the input matching circuit 123 is mounted on, for example, the first main surface 91 of the mounting substrate 9, but is not limited thereto. In a plan view from the thickness direction D1 of the mounting substrate 9, the outer peripheral shape of the inductor is a quadrangular shape.

The plurality of external connection terminals 80 are disposed over the second main surface 92 of the mounting substrate 9. A material of the plurality of external connection terminals 80 is, for example, metal (for example, copper, a copper alloy, or the like).

The plurality of external connection terminals 80 include the plurality of ground terminals 85 in addition to the antenna terminal 81, the signal input terminal 82, the signal output terminal 83, and the control terminal 84, which have been described above. The plurality of ground terminals 85 are electrically connected to the ground layer of the mounting substrate 9 as described above. The ground layer is a circuit ground of the radio frequency module 100, and the plurality of electronic components 8 of the radio frequency module 100 include an electronic component 8 electrically connected to the ground layer.

The resin layer 5 covers at least a part of each of the plurality of electronic components 8 disposed over the first main surface 91 of the mounting substrate 9 on the first main surface 91 side of the mounting substrate 9. The resin layer 5 contains resin (for example, epoxy resin). The resin layer 5 may contain a filler in addition to the resin. The resin layer 5 covers the outer peripheral surface 803 of each of the plurality of electronic components 8, and also covers the second main surface 802 of each of some electronic components 8 among the plurality of electronic components 8.

A material of the shield layer 6 includes, for example, one or more kinds of metal. The material of the shield layer 6 includes, for example, silver. The shield layer 6 covers a main surface 51 of the resin layer 5 on the opposite side to the mounting substrate 9, an outer peripheral surface 53 of the resin layer 5, and an outer peripheral surface 93 of the mounting substrate 9. The shield layer 6 is in contact with at least a part of the outer peripheral surface of the ground layer included in the mounting substrate 9. Thus, a potential of the shield layer 6 can be made equal to a potential of the ground layer.

In the radio frequency module 100 according to Embodiment 1, a substrate of the surface acoustic wave filter constituting the transmission filter 112A, a first main surface and a second main surface of the substrate, and a circuit section correspond to the first substrate 10 of the first electronic component 1, the first main surface 11 and the second main surface 12 of the first substrate 10, and the first circuit section 14. Further, a substrate of the surface acoustic wave filter constituting the reception filter 122A, a first main surface and a second main surface of the substrate, and a circuit section correspond to the second substrate 20 of the second electronic component 2, the first main surface 21 and the second main surface 22 of the second substrate 20, and the second circuit section 24. Thus, in the radio frequency module 100 according to Embodiment 1, a material of the first substrate 10 and a material of the second substrate 20 are lithium niobate. In the radio frequency module 100 according to Embodiment 1, as described above, the material of the first substrate 10 and the material of the second substrate 20 are the same. The phrase "the material of the first substrate 10 and the material of the second substrate 20 are the same" means that a main component of the first substrate 10 and a main component of the second substrate 20 are the same. The main component does not contain impurities. For example, when each of the first substrate 10 and the second substrate 20 is a lithium niobate substrate, the main components of the first substrate 10 and the second substrate 20 are lithium, niobium, and oxygen, and even when impurities are added to the lithium niobate, the main components do not contain the impurities. The material of the first substrate 10 and the material of the second substrate 20 are not limited to lithium niobate as long as these materials are the same, and may be, for example, lithium tantalate or crystal. When each of the first substrate 10 and the second substrate 20 is a lithium tantalate substrate, the main components of each of the first substrate 10 and the second substrate 20 are lithium, tantalum, and oxygen, and even when impurities are added to lithium tantalate, the main components do not contain the impurities. When each of the first substrate 10 and the second substrate 20 is a crystal substrate, the main components of the first substrate 10 and the second substrate 20 are silicon and oxygen, and even when impurities are added to the crystal, the main components do not contain the impurities.

In the radio frequency module 100 according to Embodiment 1, the first electronic component 1 includes a plurality of first pad electrodes 16 that are formed on the first main surface 11 side of the first substrate 10 and that are connected to the first circuit section 14. The first circuit section 14 includes a plurality of IDT electrodes 15. The radio frequency module 100 further includes a plurality of first bumps 101 bonded to the plurality of first pad electrodes 16 and the mounting substrate 9. In the radio frequency module 100, the plurality of IDT electrodes 15 of the acoustic wave filter of the bare chip constituting the first electronic component 1 are disposed in a first space SP1 formed between the first substrate 10 and the mounting substrate 9 by the plurality of first pad electrodes 16, the plurality of first bumps 101, the first substrate 10, the mounting substrate 9, and the resin layer 5.

In the radio frequency module 100 according to Embodiment 1, the second electronic component 2 includes a plurality of second pad electrodes 26 that are formed on the first main surface 21 side of the second substrate 20 and that are connected to the second circuit section 24. The second circuit section 24 includes a plurality of IDT electrodes 25. The radio frequency module 100 further includes a plurality of second bumps 102 bonded to the plurality of second pad electrodes 26 and the mounting substrate 9. In the radio frequency module 100, the plurality of IDT electrodes 25 of the acoustic wave filter of the bare chip constituting the second electronic component 2 are disposed in a second space SP2 formed between the second substrate 20 and the mounting substrate 9 by the plurality of second pad electrodes 26, the plurality of second bumps 102, the second substrate 20, the mounting substrate 9, and the resin layer 5.

In relation to the first electronic component 1 and the second electronic component 2, when the second main surface 12 of the first substrate 10 and the second main surface 22 of the second substrate 20 are individually roughened, the adhesion with the shield layer 6 can be improved as compared with a case where the second main surface 12 of the first substrate 10 and the second main surface 22 of the second substrate 20 are not roughened. Thus, from the viewpoint of improving the adhesion with the shield layer 6, the second main surface 12 of the first substrate 10 and the second main surface 22 of the second substrate 20 are preferably roughened. In the radio frequency module 100 according to Embodiment 1, each of the second main surface 12 of the first substrate 10 and the second main surface 22 of the second substrate 20 is rougher (has a larger surface roughness) than the main surface (second main surface 802), on the opposite side to the mounting substrate 9, of the electronic component 8 disposed over the first main surface 91 of the mounting substrate 9 and covered with the resin layer 5. Here, a maximum roughness in height (Rz) of each of the second main surface 12 of the first substrate 10 and the second main surface 22 of the second substrate 20 is larger than a maximum roughness in height of the second main surface 802 of the electronic component 8 whose second main surface 802 is covered with the resin layer 5. Regarding the surface roughness, the maximum roughness in height is a value measured from a Scanning Transmission Electron Microscope (STEM) image when a cross section of the radio frequency module 100 is observed with the STEM. The maximum roughness in height is the sum of a maximum value of a peak height and a maximum value of a valley depth in each of the second main surface 12 of the first substrate 10, the second main surface 22 of the second substrate 20, and the second main surface 802 of the electronic component 8 in the STEM image. In other words, the maximum roughness in height is a peak-to-valley value of irregularities in each of the second main surface 12 of the first substrate 10, the second main surface 22 of the second substrate 20, and the second main surface 802 of the electronic component 8. The surface roughness of each of the second main surface 12 of the first substrate 10 and the second main surface 22 of the second substrate 20 can be changed by, for example, conditions of roughening processing of the first substrate 10 and the second substrate 20 by grinding or the like in manufacturing. In discussing the relative magnitude relationship of the surface roughness, the surface roughness may be a value obtained not only by the STEM but also from a Scanning Electron Microscope (SEM) image, for example.

In the radio frequency module 100 according to Embodiment 1, the shield layer 6 includes a recognition mark 60. The recognition mark 60 includes a first portion 61 and a second portion 62. The first portion 61 is a portion of the shield layer 6 that overlaps the second main surface 12 of the first substrate 10 in the thickness direction D1 of the mounting substrate 9. The second portion 62 is a portion of the shield layer 6 that overlaps the second main surface 22 of the second substrate 20 in the thickness direction D1 of the mounting substrate 9. Hereinafter, for convenience of explanation, a portion of the shield layer 6 that overlaps neither the second main surface 12 of the first substrate 10 nor the second main surface 22 of the second substrate 20 in the thickness direction D1 of the mounting substrate 9 is also referred to as a third portion 63. In the radio frequency module 100 according to Embodiment 1, for example, the degree of reflection of light incident from the outside is different between the third portion 63, and the first portion 61 and the second portion 62. Thus, in the radio frequency module 100 according to Embodiment 1, colors of the first portion 61 and the second portion 62 are different from a color of the third portion 63 when viewed by a person. Note that FIG. 3 is a plan view of the radio frequency module 100, and the first portion 61 and the second portion 62 are hatched with dots in order to easily distinguish the first portion 61 and the second portion 62, from the third portion 63. The main surface of the first portion 61 on the opposite side to the first substrate 10 side may have irregularities reflecting the irregularities of the second main surface 12 of the first substrate 10. Additionally, the main surface of the second portion 62 on the opposite side to the second substrate 20 side may have irregularities reflecting the irregularities of the second main surface 22 of the second substrate 20.

In addition, in the radio frequency module 100 according to Embodiment 1, the second main surface 12 of the first substrate 10 in the first electronic component 1, the second main surface 22 of the second substrate 20 in the second electronic component 2, and the main surface 51 of the resin layer 5 are substantially flush with one another, but the present disclosure is not limited thereto.

(2) Summary
(2.1) Radio Frequency Module

A radio frequency module 100 according to the embodiment includes a mounting substrate 9, a first electronic component 1 and a second electronic component 2, a resin layer 5, and a shield layer 6. The mounting substrate 9 has a first main surface 91 and a second main surface 92 that are opposed to each other. The first electronic component 1 and the second electronic component 2 are disposed over the first main surface 91 of the mounting substrate 9. The resin layer 5 is disposed on the first main surface 91 of the mounting substrate 9 and covers an outer peripheral surface 13 of the first electronic component 1 and an outer peripheral surface 23 of the second electronic component 2. The shield layer 6 covers the resin layer 5, and the first electronic component 1 and the second electronic component 2. The first electronic component 1 includes a first substrate 10 having a first main surface 11 and a second main surface 12 that are opposed to each other, and a first circuit section 14 formed on the first main surface 11 side of the first substrate 10. The second electronic component 2 includes a second substrate 20 having a first main surface 21 and a second main surface 22 that are opposed to each other, and a second circuit section 24 formed on the first main surface 21 side of the second substrate 20. A material of the first substrate 10 and a material of the second substrate 20 are the same. The shield layer 6 is in contact with the second main surface 12 of the first substrate 10 and the second main surface 22 of the second substrate 20.

The radio frequency module 100 according to Embodiment 1 can improve the heat dissipation. In the radio frequency module 100 according to Embodiment 1, it is preferable that the shield layer 6 be in contact with the entire second main surface 12 of the first substrate 10 and the entire second main surface 22 of the second substrate 20 from the viewpoint of improving the heat dissipation. However, it is not essential for the shield layer 6 to be in contact with the entire second main surface 12 of the first substrate 10 and the entire second main surface 22 of the second substrate 20.

The radio frequency module 100 according to Embodiment 1 can dissipate the heat generated in the first electronic component 1 through the second main surface 12 of the first substrate 10 and the shield layer 6. Thus, the radio frequency module 100 according to Embodiment 1 can suppress an increase in temperature of the lithium niobate substrate or the lithium tantalate substrate constituting the first substrate 10. As a result, in the radio frequency module 100 according to Embodiment 1, it is possible to stabilize a temperature characteristic of the acoustic wave filter constituting the first electronic component 1, and to stabilize characteristics of the radio frequency module 100.

In addition, the radio frequency module 100 according to Embodiment 1 can dissipate the heat generated in the second electronic component 2 through the second main surface 22 of the second substrate 20 and the shield layer 6. Thus, in the radio frequency module 100 according to Embodiment 1, it is possible to suppress an increase in temperature of the lithium niobate substrate or the lithium tantalate substrate constituting the second substrate 20. As a result, in the radio frequency module 100 according to Embodiment 1, it is possible to stabilize a temperature characteristic of the acoustic wave filter constituting the second electronic component 2, and to stabilize the characteristics of the radio frequency module 100.

In addition, in the radio frequency module 100 according to Embodiment 1, since a material of the first substrate 10 and a material of the second substrate 20 are the same, there is an advantage that, for example, when the first substrate 10 and the second substrate 20 are ground from the opposite side to the mounting substrate 9 side in manufacturing, the grinding is easily performed. As a manufacturing method of the radio frequency module 100, for example, a manufacturing method including a first process, a second process, a third process, and a fourth process can be adopted. The first process is a process of arranging the plurality of electronic components 8 including the first electronic component 1 and the second electronic component 2 on the first main surface 91 of the mounting substrate 9. The second process is a process of forming a resin material layer that covers the plurality of electronic components 8 and is an original material of the resin layer 5 on the first main surface 91 side of the mounting substrate 9. The third process is a process of forming the resin layer 5 and thinning the first substrate 10 and the second substrate 20 by grinding the resin material layer, and the first substrate 10 and the second substrate 20 after exposing the first substrate 10 of the first electronic component 1 and the second substrate 20 of the second electronic component 2 by grinding the resin material layer from the main surface on the side opposite to the mounting substrate 9 side in the resin material layer. The fourth process is a process of forming the shield layer 6 in contact with the main surface 51 of the resin layer 5, the second main surface 12 of the first substrate 10, and the second main surface 22 of the second substrate 20 by, for example, a sputtering method, a vapor deposition method, or a printing method.

Further, in the radio frequency module 100 according to Embodiment 1, each of the second main surface 12 of the first substrate 10 and the second main surface 22 of the second substrate 20 is rougher than the main surface (second main surface 802) of the electronic component 8 covered with the resin layer 5 on the opposite side to the mounting substrate 9 side. Thus, in the radio frequency module 100 according to Embodiment 1, it is possible to improve the adhesion between the shield layer 6, and the first electronic component 1 and the second electronic component 2. Further, in the radio frequency module 100 according to Embodiment 1, an unwanted wave (for example, an unwanted bulk wave) propagating in a direction along the thickness direction of the lithium niobate substrate or the lithium tantalate substrate constituting the first substrate 10 can be scattered at the interface between the first substrate 10 and the shield layer 6, and filter characteristics of the acoustic wave filter constituting the first electronic component 1 can be improved. Further, in the radio frequency module 100 according to Embodiment 1, an unwanted wave (for example, an unwanted bulk wave) propagating in a direction along the thickness direction of the lithium niobate substrate or the lithium tantalate substrate constituting the second substrate 20 can be scattered at the interface between the second substrate 20 and the shield layer 6, and filter characteristics of the acoustic wave filter constituting the second electronic component 2 can be improved. The improvement of the filter characteristics includes, for example, suppression of harmonic distortion and the like.

Further, in the radio frequency module 100 according to Embodiment 1, the shield layer 6 includes a recognition mark 60. Thus, in the radio frequency module 100 according to Embodiment 1, for example, a person can visually recognize the recognition mark 60.

Further, in the radio frequency module 100 according to Embodiment 1, the first electronic component 1 is a transmission filter 112B constituting a duplexer 132B, and the acoustic wave filter constituting the second electronic component 2 is a reception filter 122B constituting the duplexer 132B. Thus, in the radio frequency module 100 according to Embodiment 1, it is possible to suppress the deterioration in characteristics of the reception filter 122B due to the heat propagating from the transmission filter 112B to the reception filter 122B. In addition, in the radio frequency module 100 according to Embodiment 1, it is possible to suppress the deterioration in isolation characteristic between the transmission filter 112B and the reception filter 122B.

(2.2) Communication Device

A communication device 300 according to Embodiment 1 includes a signal processing circuit 301 and the radio frequency module 100. The signal processing circuit 301 is connected to the radio frequency module 100 and performs signal processing of a radio frequency signal.

Since the communication device 300 according to Embodiment 1 includes the radio frequency module 100, it is possible to improve the heat dissipation.

A plurality of electronic components constituting the signal processing circuit 301 may be mounted on the above-described circuit board, or may be mounted on a circuit board (the second circuit board) different from a circuit board (the first circuit board) mounted with the radio frequency module 100, for example.

(3) Modifications of Radio Frequency Module (3.1) Modification 1

Figure 5:
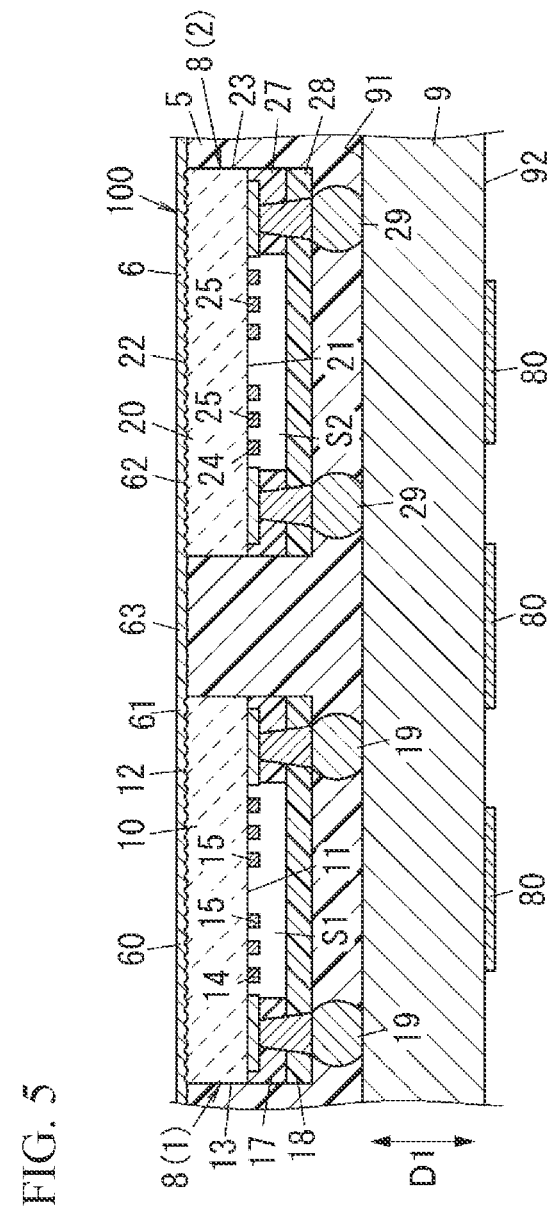
FIG. 5 is an enlarged cross-sectional view of a part of a radio frequency module according to Modification 1 of Embodiment 1.

A radio frequency module 100 according to Modification 1 of Embodiment 1 will be described with reference to FIG. 5. Regarding the radio frequency module 100 according to Modification 1, constituent elements similar to those of the radio frequency module 100 according to Embodiment 1 are denoted by the same reference signs, and description thereof will be omitted.

The radio frequency module 100 according to Modification 1 is different from the radio frequency module 100 according to Embodiment 1 in that the first electronic component 1 includes a first spacer layer 17, a first cover member 18, and a plurality of first terminals 19 as constituent elements of a first package structure.

The first spacer layer 17 and the first cover member 18 are provided on the first main surface 11 side of the first substrate 10. The first spacer layer 17 surrounds the plurality of IDT electrodes 15 in a plan view from the thickness direction D1 of the mounting substrate 9. In a plan view from the thickness direction D1 of the mounting substrate 9, the first spacer layer 17 has a rectangular frame shape. The first spacer layer 17 has an electrical insulation property. A material of the first spacer layer 17 is epoxy resin, polyimide, or the like. The first cover member 18 has a flat plate shape. The first cover member 18 is disposed on the first spacer layer 17 so as to face the first substrate 10 in the thickness direction D1 of the mounting substrate 9. The first cover member 18 overlaps the plurality of IDT electrodes 15 in the thickness direction D1 of the mounting substrate 9, and is separated from the plurality of IDT electrodes 15 in the thickness direction D1 of the mounting substrate 9. The first cover member 18 has an electrical insulation property. A material of the first cover member 18 is epoxy resin, polyimide, or the like. The first electronic component 1 has a first space S1 surrounded by the first substrate 10, the first spacer layer 17, and the first cover member 18. In the first electronic component 1, gas is contained in the first space S1. The gas is air, an inert gas (for example, nitrogen gas), or the like. The plurality of first terminals 19 are exposed from the first cover member 18. Each of the plurality of first terminals 19 is, for example, a bump. Each bump is, for example, a solder bump. Each bump is not limited to a solder bump and may be, for example, a gold bump.

In addition, the radio frequency module 100 according to Modification 1 is different from the radio frequency module 100 according to Embodiment 1 in that the second electronic component 2 includes a second spacer layer 27, a second cover member 28, and a plurality of second terminals 29 as constituent elements of a second package structure.

The second spacer layer 27 and the second cover member 28 are provided on the first main surface 21 side of the second substrate 20. The second spacer layer 27 surrounds the plurality of IDT electrodes 25 in a plan view from the thickness direction D1 of the mounting substrate 9. In a plan view from the thickness direction D1 of the mounting substrate 9, the second spacer layer 27 has a rectangular frame shape. The second spacer layer 27 has an electrical insulation property. A material of the second spacer layer 27 is epoxy resin, polyimide, or the like. The second cover member 28 has a flat plate shape. The second cover member 28 is disposed on the second spacer layer 27 so as to face the second substrate 20 in the thickness direction D1 of the mounting substrate 9. The second cover member 28 overlaps the plurality of IDT electrodes 25 in the thickness direction D1 of the mounting substrate 9, and is separated from the plurality of IDT electrodes 25 in the thickness direction D1 of the mounting substrate 9. The second cover member 28 has an electrical insulation property. A material of the second cover member 28 is epoxy resin, polyimide, or the like. The second electronic component 2 has a second space S2 surrounded by the second substrate 20, the second spacer layer 27, and the second cover member 28. In the second electronic component 2, gas is contained in the second space S2. The gas is air, an inert gas (for example, nitrogen gas), or the like. The plurality of second terminals 29 are exposed from the second cover member 28. Each of the plurality of second terminals 29 is, for example, a bump. Each bump is, for example, a solder bump. Each bump is not limited to a solder bump and may be, for example, a gold bump.

In the radio frequency module 100 according to Modification 1, a material of the first substrate 10 and a material of the second substrate 20 are the same, similar to the radio frequency module 100 according to Embodiment 1. Further, the shield layer 6 is in contact with the second main surface 12 of the first substrate 10 and the second main surface 22 of the second substrate 20. As a result, in the radio frequency module 100 according to Modification 1, it is possible to improve the heat dissipation, similar to the radio frequency module 100 according to Embodiment 1.

(3.2) Modification 2

Figure 6:
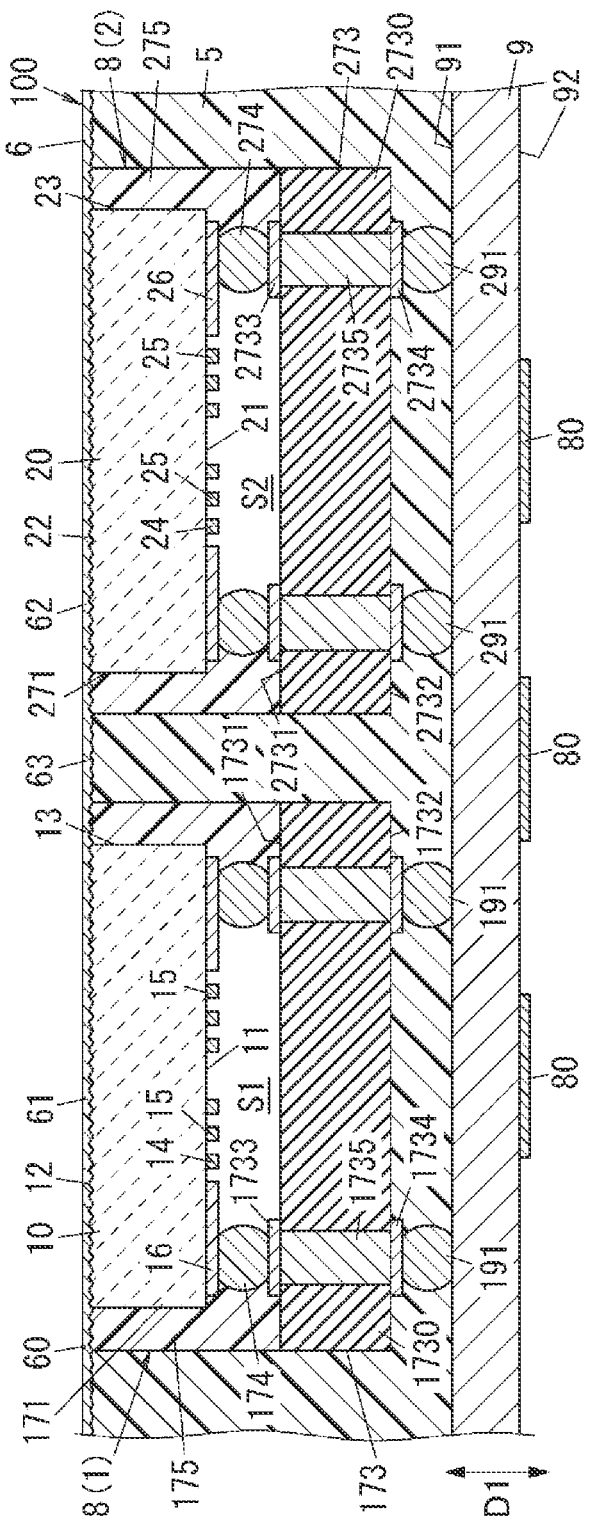
FIG. 6 is an enlarged cross-sectional view of a part of a radio frequency module according to Modification 2 of Embodiment 1.

A radio frequency module 100 according to Modification 2 of Embodiment 1 will be described with reference to FIG. 6. Regarding the radio frequency module 100 according to Modification 2, constituent elements similar to those of the radio frequency module 100 according to Embodiment 1 are denoted by the same reference signs, and description thereof will be omitted.

The radio frequency module 100 according to Modification 2 is different from the radio frequency module 100 according to Embodiment 1 in that the first electronic component 1 includes a first package substrate 173, a plurality of bumps 174, and a first sealing resin portion 175 as constituent elements of the first package structure in addition to a first filter chip 171 including the first substrate 10, the first circuit section 14, and the plurality of first pad electrodes 16.

The first package substrate 173 includes a first support body 1730, a plurality of electrodes 1733, and a plurality of external connection electrodes 1734. The first support body 1730 has a flat plate shape and has a first main surface 1731 and a second main surface 1732 that are opposed to each other. The plurality of electrodes 1733 are disposed over the first main surface 1731 of the first support body 1730. Additionally, the plurality of external connection electrodes 1734 are disposed on the second main surface 1732 of the first support body 1730. The first package substrate 173 further includes a plurality of through-electrodes 1735 electrically connecting the plurality of electrodes 1733 and the plurality of external connection electrodes 1734 in a one-to-one manner. The first support body 1730 has an electrical insulation property. The first support body 1730 is, for example, a ceramic substrate (for example, an alumina substrate). An outer peripheral shape of the first package substrate 173 is a rectangular shape, but is not limited thereto.

The plurality of bumps 174 bond the plurality of first pad electrodes 16 of the first filter chip 171 and the plurality of electrodes 1733 of the first package substrate 173. The first sealing resin portion 175 is disposed on the first package substrate 173 and covers the outer peripheral surface of the first filter chip 171. A first space S1 surrounded by the first filter chip 171, the first package substrate 173, and the first sealing resin portion 175 is formed in the first electronic component 1.

The first electronic component 1 is a Chip Size Package (CSP) type acoustic wave filter. The first filter chip 171 is flip-chip mounted on the first package substrate 173, and the outer peripheral surface of the first filter chip 171 is covered with the first sealing resin portion 175 on the first package substrate 173. When viewed in a thickness direction of the first filter chip 171, the sizes of the first package substrate 173 and the first sealing resin portion 175 are slightly larger than the chip size of the first filter chip 171.

The radio frequency module 100 further includes a plurality of first bumps 191 bonded to the plurality of external connection electrodes 1734 of the first electronic component 1 and the mounting substrate 9.

The radio frequency module 100 according to Modification 2 is different from the radio frequency module 100 according to Embodiment 1 in that the second electronic component 2 includes a second package substrate 273, a plurality of bumps 274, and a second sealing resin portion 275 as constituent elements of the second package structure in addition to the second filter chip 271 including the second substrate 20, the second circuit section 24, and the plurality of second pad electrodes 26.

The second package substrate 273 includes a second support body 2730, a plurality of electrodes 2733, and a plurality of external connection electrodes 2734. The second support body 2730 has a flat plate shape and includes a first main surface 2731 and a second main surface 2732 that are opposed to each other. The plurality of electrodes 2733 are disposed on the first main surface 2731 of the second support body 2730. Additionally, the plurality of external connection electrodes 2734 are disposed on the second main surface 2732 of the second support body 2730. The second package substrate 273 further includes a plurality of through-electrodes 2735 electrically connecting the plurality of electrodes 2733 and the plurality of external connection electrodes 2734 in a one-to-one manner. The second support body 2730 has an electrical insulation property. The second support body 2730 is, for example, a ceramic substrate (for example, an alumina substrate). An outer peripheral shape of the second package substrate 273 is a rectangular shape, but is not limited thereto.

The plurality of bumps 274 bond the plurality of second pad electrodes 26 of the second filter chip 271 and the plurality of electrodes 2733 of the second package substrate 273. The second sealing resin portion 275 is disposed on the second package substrate 273 and covers an outer peripheral surface of the second filter chip 271. A second space S2 surrounded by the second filter chip 271, the second package substrate 273, and the second sealing resin portion 275 is formed in the second electronic component 2.

The second electronic component 2 is a CSP type acoustic wave filter. The second filter chip 271 is flip-chip mounted on the second package substrate 273, and an outer peripheral surface of the second filter chip 271 is covered with the second sealing resin portion 275 on the second package substrate 273. When viewed in a thickness direction of the second filter chip 271, the sizes of the second package substrate 273 and the second sealing resin portion 275 are slightly larger than the chip size of the second filter chip 271.

The radio frequency module 100 further includes a plurality of second bumps 291 bonded to the plurality of external connection electrodes 2734 of the second electronic component 2 and the mounting substrate 9.

In the radio frequency module 100 according to Modification 2, a material of the first substrate 10 and a material of the second substrate 20 are the same, similar to the radio frequency module 100 according to Embodiment 1. Further, the shield layer 6 is in contact with the second main surface 12 of the first substrate 10 and the second main surface 22 of the second substrate 20. Thus, in the radio frequency module 100 according to Modification 2, it is possible to improve the heat dissipation, similar to the radio frequency module 100 according to Embodiment 1.

(3.3) Modification 3

Figure 7:
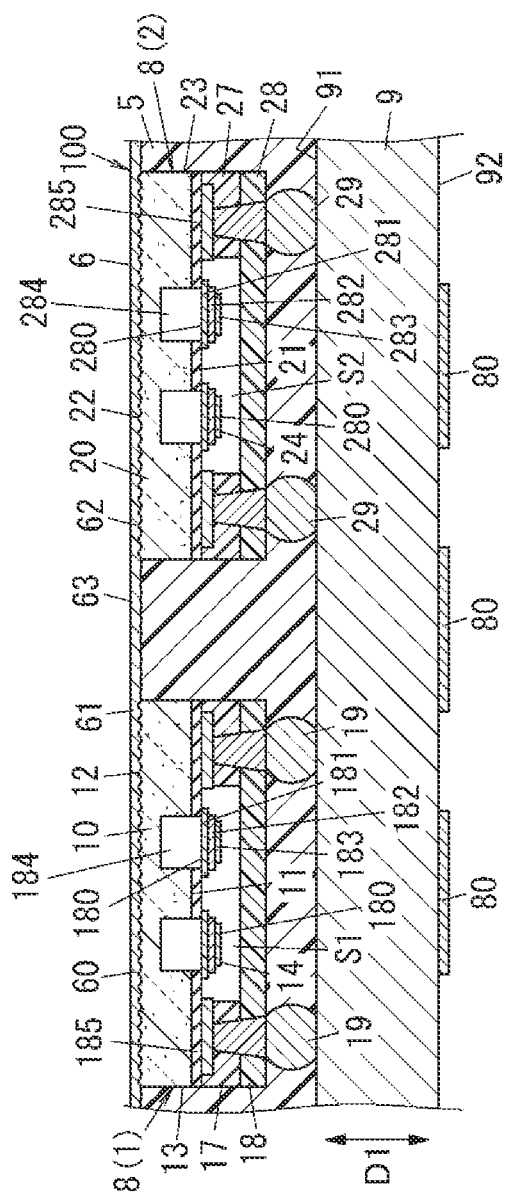
FIG. 7 is an enlarged cross-sectional view of a part of a radio frequency module according to Modification 3 of Embodiment 1.

A radio frequency module 100 according to Modification 3 of Embodiment 1 will be described with reference to FIG. 7. Regarding the radio frequency module 100 according to Modification 3, constituent elements similar to those of the radio frequency module 100 according to Modification 1 of Embodiment 1 are denoted by the same reference signs, and description thereof will be omitted.

The radio frequency module 100 according to Modification 3 is different from the radio frequency module 100 according to Modification 1 in that the first electronic component 1 is a Bulk Acoustic Wave (BAW) filter. In the radio frequency module 100 according to Modification 3, the first substrate 10 of the first electronic component 1 is a silicon substrate, and each of the plurality of acoustic wave resonators is a first Bulk Acoustic Wave (BAW) resonator 180.

The first BAW resonator 180 includes a first electrode 181, a piezoelectric film 182, and a second electrode 183. The piezoelectric film 182 is formed on the first electrode 181. The second electrode 183 is formed on the piezoelectric film 182.

The first BAW resonator 180 includes an electrically insulating film 185 formed on the first main surface 11 of the first substrate 10. A material of the electrically insulating film 185 is, for example, silicon oxide. A material of the piezoelectric film 182 is, for example, AlN, ScAlN, or PZT.

The first BAW resonator 180 includes a cavity 184 on the side of the first electrode 181 opposite to the piezoelectric film 182 side. The first BAW resonator 180 can suppress the propagation of acoustic wave energy to the first substrate 10 side by increasing an acoustic impedance ratio between the first electrode 181 and a medium immediately below the first electrode 181, and can increase an electromechanical coupling coefficient compared to a case where the cavity 184 is not provided. The first BAW resonator 180 is a Film Bulk Acoustic Resonator (FBAR).

The radio frequency module 100 according to Modification 3 is different from the radio frequency module 100 according to Modification 1 in that the second electronic component 2 is a BAW filter. In the radio frequency module 100 according to Modification 3, the second substrate 20 of the second electronic component 2 is a silicon substrate, and each of the plurality of acoustic wave resonators is a second BAW resonator 280.

The second BAW resonator 280 includes a first electrode 281, a piezoelectric film 282, and a second electrode 283. The piezoelectric film 282 is formed on the first electrode 281. The second electrode 283 is formed on the piezoelectric film 282.

The second BAW resonator 280 includes an electrically insulating film 285 formed on the first main surface 21 of the second substrate 20. A material of the electrically insulating film 285 is, for example, silicon oxide. A material of the piezoelectric film 282 is, for example, AlN, ScAlN, or PZT.

The second BAW resonator 280 has a cavity 284 on the side of the first electrode 281 opposite to the piezoelectric film 282 side. The second BAW resonator 280 is an FBAR.

In the radio frequency module 100 according to Modification 3, the material of the first substrate 10 and the material of the second substrate 20 are the same, similar to the radio frequency module 100 according to Modification 1. Further, the shield layer 6 is in contact with the second main surface 12 of the first substrate 10 and the second main surface 22 of the second substrate 20. Thus, in the radio frequency module 100 according to Modification 3, it is possible to improve the heat dissipation, similar to the radio frequency module 100 according to Modification 1. The phrase "the material of the first substrate 10 and the material of the second substrate 20 are the same" means that a main component of the first substrate 10 and a main component of the second substrate 20 are the same. The main component does not contain impurities. For example, when each of the first substrate 10 and the second substrate 20 is a silicon substrate, a main component of each of the first substrate 10 and the second substrate 20 is silicon, and even when impurities are added to the silicon substrate, the main component does not contain the impurities.

(3.4) Modification 4

Figure 8:
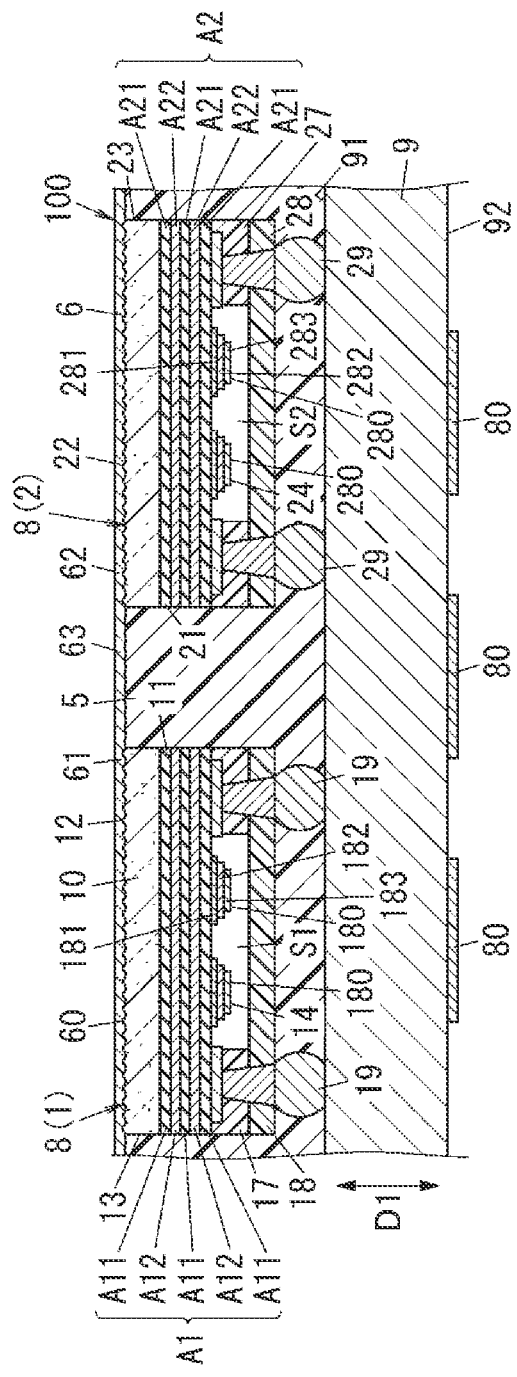
FIG. 8 is an enlarged cross-sectional view of a part of a radio frequency module according to Modification 4 of Embodiment 1.

A radio frequency module 100 according to Modification 4 of Embodiment 1 will be described with reference to FIG. 8. Regarding the radio frequency module 100 according to Modification 4, constituent elements similar to those of the radio frequency module 100 according to Modification 3 of Embodiment 1 are denoted by the same reference signs, and description thereof will be omitted.

The radio frequency module 100 according to Modification 4 is different from the radio frequency module 100 according to Modification 3 in that the first BAW resonator 180 includes an acoustic reflection layer A1 interposed between the first substrate 10 and the first electrodes 181 of the plurality of first BAW resonators 180.

The acoustic reflection layer A1 is provided on the first main surface 11 of the first substrate 10. The plurality of first electrodes 181 are provided on the acoustic reflection layer A1. The acoustic reflection layer A1 includes at least one (for example, three) low-acoustic-impedance layer A11 and at least one (for example, two) high-acoustic-impedance layer A12. The low-acoustic-impedance layer A11 has a lower acoustic impedance than that of the high-acoustic-impedance layer A12. In the radio frequency module 100 according to Modification 4, the first BAW resonator 180 is a Solidly Mounted Resonator (SMR). A material of the plurality of high-acoustic-impedance layers A12 is, for example, platinum. In addition, a material of the plurality of low-acoustic-impedance layers A11 is, for example, silicon oxide. The material of the plurality of high-acoustic-impedance layers A12 is not limited to platinum, and may be metal such as tungsten, tantalum or the like. Further, the material of the plurality of high-acoustic-impedance layers A12 is not limited to the metal, and may be, for example, an insulator. Further, the plurality of high-acoustic-impedance layers A12 are not necessarily made of the same material but may be made of different materials from each other, for example. Further, the plurality of low-acoustic-impedance layers A11 are not necessarily made of the same material but may be made of different materials from each other, for example. In addition, the number of high-acoustic-impedance layers A12 and the number of low-acoustic-impedance layers A11 are not limited to being different from each other, and may be the same.

The radio frequency module 100 according to Modification 4 is different from the radio frequency module 100 according to Modification 3 in that the second BAW resonator 280 includes an acoustic reflection layer A2 interposed between the second substrate 20 and the first electrodes 281 of the plurality of second BAW resonators 280.

The acoustic reflection layer A2 is provided on the first main surface 21 of the second substrate 20. The plurality of first electrodes 281 are provided on the acoustic reflection layer A2. The acoustic reflection layer A2 includes at least one (for example, three) low-acoustic-impedance layer A21 and at least one (for example, two) high-acoustic-impedance layer A22. The low-acoustic-impedance layer A21 has a lower acoustic impedance than that of the high-acoustic-impedance layer A22. In the radio frequency module 100 according to Modification 4, the second BAW resonator 280 is an SMR. A material of the plurality of high-acoustic-impedance layers A22 is, for example, platinum. In addition, a material of the plurality of low-acoustic-impedance layers A21 is, for example, silicon oxide. The material of the plurality of high-acoustic-impedance layers A22 is not limited to platinum, and may be metal such as tungsten, tantalum or the like. Further, the material of the plurality of high-acoustic-impedance layers A22 is not limited to the metal, and may be, for example, an insulator. Further, the plurality of high-acoustic-impedance layers A22 are not necessarily made of the same material but may be made of different materials from each other, for example. Further, the plurality of low-acoustic-impedance layers A21 are not necessarily made of the same material but may be made of different materials from each other, for example. In addition, the number of high-acoustic-impedance layers A22 and the number of low-acoustic-impedance layers A21 are not limited to being different from each other, and may be the same.

In the radio frequency module 100 according to Modification 4, the material of the first substrate 10 and the material of the second substrate 20 are the same, similar to the radio frequency module 100 according to Modification 3. Further, the shield layer 6 is in contact with the second main surface 12 of the first substrate 10 and the second main surface 22 of the second substrate 20. Thus, in the radio frequency module 100 according to Modification 4, it is possible to improve the heat dissipation, similar to the radio frequency module 100 according to Modification 3.

Embodiment 2

Figure 9:
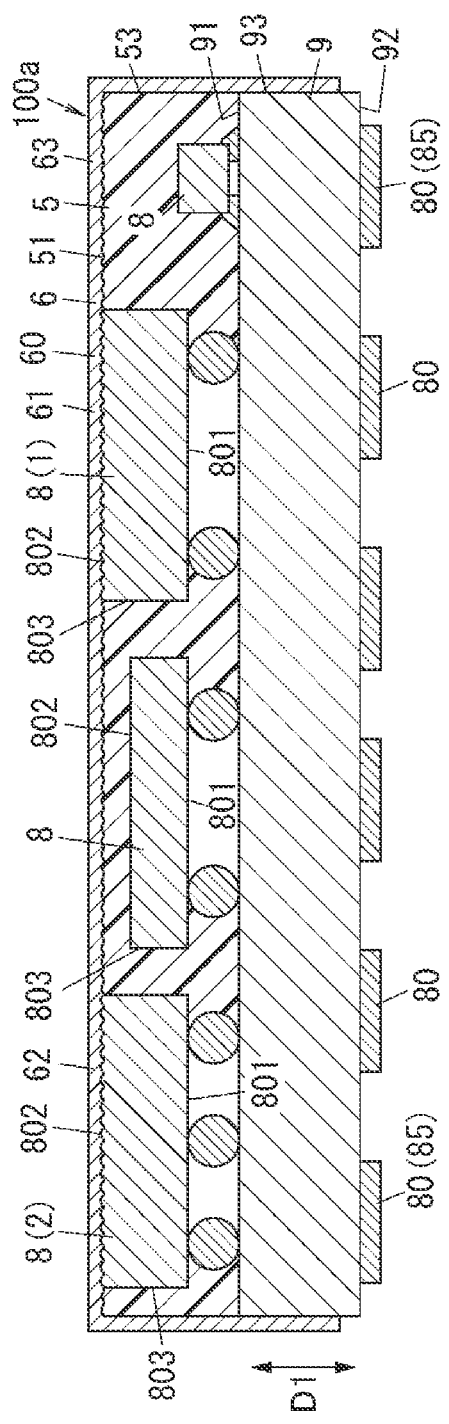
FIG. 9 is a cross-sectional view of a radio frequency module according to Embodiment 2.
Figure 10:
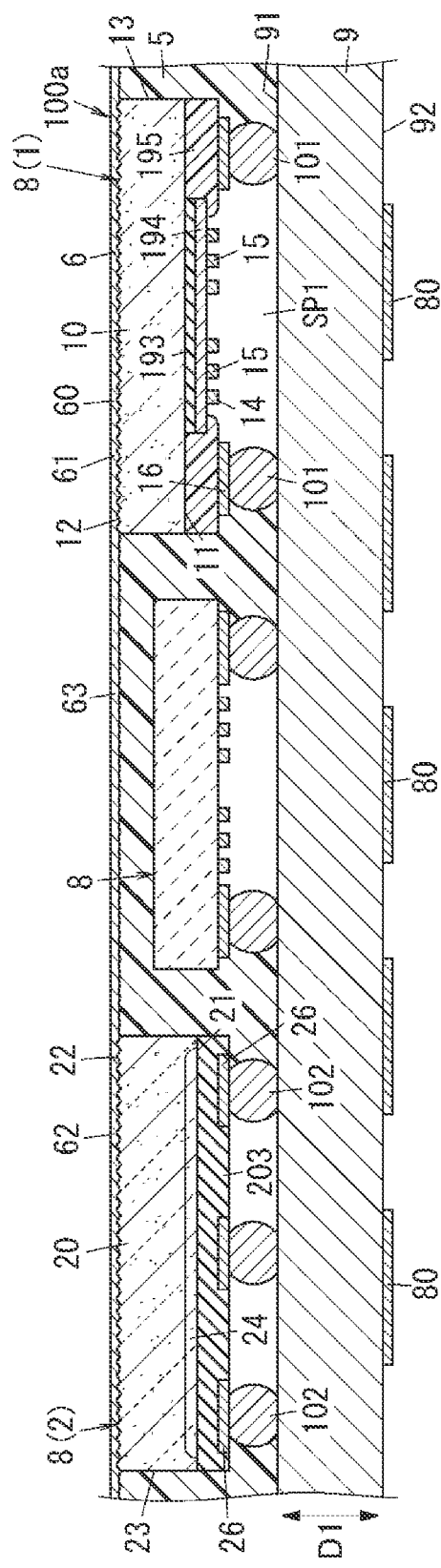
FIG. 10 is an enlarged cross-sectional view of a part of the above-described radio frequency module.

A radio frequency module 100a according to Embodiment 2 will be described with reference to FIGS. 9 and 10.

Regarding the radio frequency module 100a according to Embodiment 2, constituent elements similar to those of the radio frequency module 100 according to Embodiment 1 are denoted by the same reference signs, and description thereof will be omitted. Note that a circuit configuration of the radio frequency module 100a is similar to the circuit configuration of the radio frequency module 100 according to Embodiment 1 described with reference to FIG. 4.

In the radio frequency module 100a according to Embodiment 2, among the plurality of electronic components 8 disposed over the mounting substrate 9, the first electronic component 1 is an acoustic wave filter, and the second electronic component 2 is an IC chip. Here, the first substrate 10 included in the first electronic component 1 is a silicon substrate. Further, the second substrate 20 included in the second electronic component 2 is a silicon substrate. The first electronic component 1 is, for example, the transmission filter 112B (see FIG. 4), but is not limited thereto, and may be, for example, the transmission filter 112A (see FIG. 4).

The acoustic wave filter constituting the first electronic component 1 is an acoustic wave filter of a bare chip. As illustrated in FIG. 10, the acoustic wave filter of the bare chip includes a low-acoustic-velocity film 193 provided on the first main surface 11 of the first substrate 10, a piezoelectric layer 194 provided on the low-acoustic-velocity film 193, a plurality of IDT electrodes 15 provided on the piezoelectric layer 194, and a plurality of first pad electrodes 16. The plurality of first pad electrodes 16 are provided over the first main surface 11 of the first substrate 10. The acoustic wave filter of the bare chip has a rectangular shape in a plan view from the thickness direction, but is not limited thereto and may have, for example, a square shape.

The low-acoustic-velocity film 193 is positioned away from the outer edge of the first substrate 10 in a plan view from the thickness direction of the acoustic wave filter of the bare chip. The acoustic wave filter of the bare chip further includes an insulating layer 195 that covers a region of the first main surface 11 of the first substrate 10 that is not covered with the low-acoustic-velocity film 193. The insulating layer 195 has an electrical insulation property. The insulating layer 195 is formed along the outer edge of the first substrate 10 on the first main surface 11 of the first substrate 10. The insulating layer 195 surrounds the plurality of IDT electrodes 15. In a plan view from the thickness direction of the acoustic wave filter of the bare chip, the insulating layer 195 has a frame shape (for example, a rectangular frame shape). A part of the insulating layer 195 overlaps an outer peripheral portion of the piezoelectric layer 194 in the thickness direction of the acoustic wave filter of the bare chip. An outer peripheral surface of the piezoelectric layer 194 and an outer peripheral surface of the low-acoustic-velocity film 193 are covered with the insulating layer 195. A material of the insulating layer 195 is epoxy resin, polyimide, or the like.

The plurality of first pad electrodes 16 are provided on the first main surface 11 of the first substrate 10 with the insulating layer 195 interposed therebetween.

A material of the piezoelectric layer 194 is, for example, lithium niobate or lithium tantalate. The low-acoustic-velocity film 193 is a film in which an acoustic velocity of a bulk wave propagating through the low-acoustic-velocity film 193 is lower than an acoustic velocity of a bulk wave propagating through the piezoelectric layer 194. A material of the low-acoustic-velocity film 193 is, for example, silicon oxide. The material of the low-acoustic-velocity film 193 is not limited to silicon oxide. The material of the lowacoustic-velocity film 193 may be, for example, silicon oxide, glass, silicon oxynitride, tantalum oxide, a compound obtained by adding fluorine, carbon, or boron to silicon oxide, or a material containing any of these materials as a main component. In the first substrate 10, an acoustic velocity of a bulk wave propagating through the first substrate 10 is higher than an acoustic velocity of an acoustic wave propagating through the piezoelectric layer 194. Here, the bulk wave propagating through the first substrate 10 is a bulk wave having the lowest acoustic velocity among a plurality of bulk waves propagating through the first substrate 10.

The acoustic wave filter of the bare chip may further include a high-acoustic-velocity film provided between the first substrate 10 and the low-acoustic-velocity film 193. The high-acoustic-velocity film is a film in which an acoustic velocity of a bulk wave propagating through the high-acoustic-velocity film is higher than the acoustic velocity of the acoustic wave propagating through the piezoelectric layer 194. A material of the high-acoustic-velocity film is, for example, at least one material selected from the group consisting of diamond-like carbon, aluminum nitride, aluminum oxide, silicon carbide, silicon nitride, silicon, sapphire, a piezoelectric material (lithium tantalate, lithium niobate, or crystal), alumina, zirconia, cordierite, mullite, steatite, forsterite, magnesia, and diamond. The material of the high-acoustic-velocity film may be a material containing any one of the materials described above as a main component, or a material containing a mixture containing any one of the materials described above as a main component.

A thickness of the piezoelectric layer 194 is, for example, equal to or less than 3.5λ, when λ is defined as the wave length of an acoustic wave determined by an electrode finger pitch of the IDT electrodes 15. A thickness of the low-acoustic-velocity film 193 is, for example, equal to or less than 2.0λ.

The acoustic wave filter of the bare chip may include, for example, an adhesion layer interposed between the low-acoustic-velocity film 193 and the piezoelectric layer 194. The adhesion layer is made of, for example, resin (epoxy resin, polyimide resin). Further, the acoustic wave filter of the bare chip may include a dielectric film between the low-acoustic-velocity film 193 and the piezoelectric layer 194, on the piezoelectric layer 194, or under the low-acoustic-velocity film 193.

Figure 4:
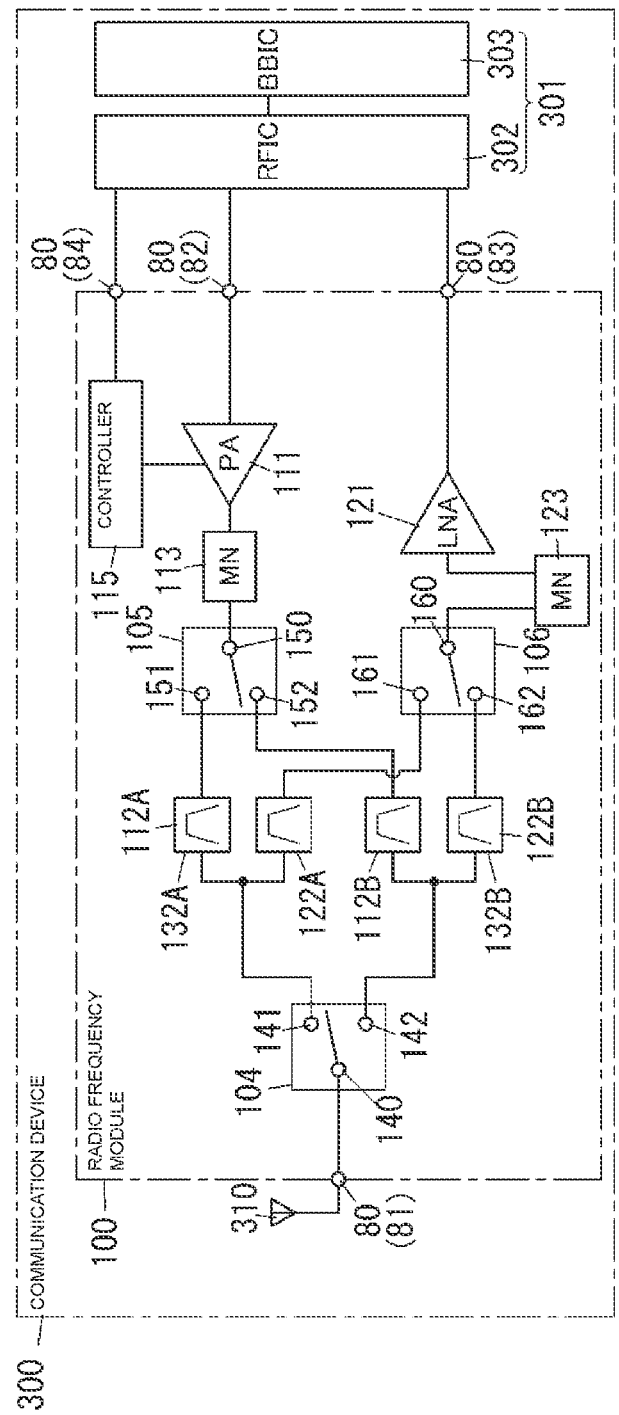
FIG. 4 is a circuit configuration diagram of a communication device including the above-described radio frequency module.

In addition, the IC chip constituting the second electronic component 2 includes, for example, the power amplifier 111 (see FIG. 4). In the radio frequency module 100a according to Embodiment 2, a multilayer structure portion 203 including a wiring layer and a passivation film is provided on the first main surface 21 of the second substrate 20 in the second electronic component 2. Further, in the radio frequency module 100a according to Embodiment 2, in the second electronic component 2, the plurality of second pad electrodes 26 connected to the second circuit section 24 through the wiring layer and the like of the multilayer structure portion 203 are exposed from the multilayer structure portion 203. The multilayer structure portion 203 includes each of electrodes of a transistor (for example, the HBT) and the like constituting the second circuit section 24.

In the radio frequency module 100a according to Embodiment 2, the material of the first substrate 10 and the material of the second substrate 20 are the same, similar to the radio frequency module 100 according to Modification 4 of Embodiment 1. Further, the shield layer 6 is in contact with the second main surface 12 of the first substrate 10 and the second main surface 22 of the second substrate 20. Thus, in the radio frequency module 100a according to Embodiment 2, it is possible to improve the heat dissipation, similar to the radio frequency module 100 according to Modification 4 of Embodiment 1.

The phrase "the material of the first substrate 10 and the material of the second substrate 20 are the same" means that a main component of the first substrate 10 and a main component of the second substrate 20 are the same. The main component does not contain impurities. For example, when each of the first substrate 10 and the second substrate 20 is a silicon substrate, a main component of each of the first substrate 10 and the second substrate 20 is silicon, and even when impurities are added to the silicon substrate, the main component does not contain the impurities.

From the viewpoint of improving the heat dissipation of the radio frequency module 100a as a whole, it is preferable that the first electronic component 1 be the transmission filter 112B or the transmission filter 112A being more likely to generate heat than the reception filters 122A and 122B. Thus, in the radio frequency module 100a, it is possible to suppress the variations in characteristics of the first electronic component 1 and the variations in characteristics of the electronic component 8 adjacent to the first electronic component 1 among the plurality of electronic components 8.

The IC chip constituting the second electronic component 2 is not limited to the power amplifier 111, and may be, for example, the controller 115 (see FIG. 4) that controls the power amplifier 111.

Further, the IC chip constituting the second electronic component 2 may be the low-noise amplifier 121 (see FIG. 4). Further, the IC chip constituting the second electronic component 2 may be an IC chip including at least one of the first switch 104 (see FIG. 4), the second switch 105 (see FIG. 4), and the third switch 106 (see FIG. 4).

Further, the IC chip constituting the second electronic component 2 may be an IC chip of one chip including the low-noise amplifier 121 and the third switch 106. The IC chip constituting the second electronic component 2 may be an IC chip of one chip including the low-noise amplifier 121, the first switch 104, the second switch 105, and the third switch 106.

Also, the IC chip constituting the second electronic component 2 may be an Integrated Passive Device (IPD).

(Modification of Embodiment 2)

Figure 11:
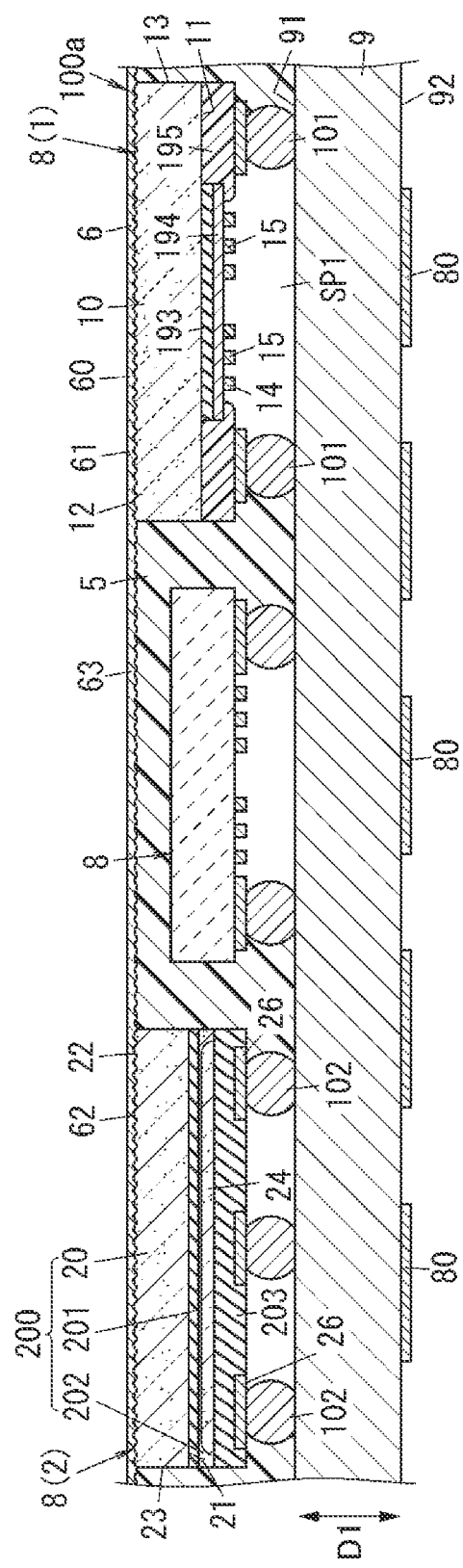
FIG. 11 is an enlarged cross-sectional view of a part of a radio frequency module according to Modification of Embodiment 2.

A radio frequency module 100a according to a modification of Embodiment 2 will be described with reference to FIG. 11. Regarding the radio frequency module 100a according to the modification of Embodiment 2, constituent elements similar to those of the radio frequency module 100a according to Embodiment 2 are denoted by the same reference signs, and description thereof will be omitted.

In the radio frequency module 100a according to the modification of Embodiment 2, the second electronic component 2 includes an insulating layer 201 provided on the first main surface 21 of the second substrate 20 that is a silicon substrate, and a silicon layer 202 provided on the insulating layer 201. In the second electronic component 2, the second circuit section 24 is formed on the silicon layer 202 on the first main surface 21 side of the second substrate 20. In the second electronic component 2, the second substrate 20, the insulating layer 201, and the silicon layer 202 constitute a Silicon on Insulator (SOI) substrate 200. In the radio frequency module 100a according to the modification of Embodiment 2, a multilayer structure portion 203 including a wiring layer and a passivation film is provided on the silicon layer 202 in the second electronic component 2. In addition, in the radio frequency module 100a according to the modification of Embodiment 2, in the second electronic component 2, the plurality of second pad electrodes 26 connected to the second circuit section 24 through the wiring layer and the like of the multilayer structure portion 203 are exposed from the multilayer structure portion 203.

In the radio frequency module 100a according to the modification of Embodiment 2, the shield layer 6 is in contact with the second main surface 12 of the first substrate 10 and the second main surface 22 of the second substrate 20, similar to the radio frequency module 100a according to Embodiment 2. Thus, it is possible to improve the heat dissipation.

In addition, in the radio frequency module 100a according to the modification of Embodiment 2, since the second electronic component 2 is an IC chip using the SOI substrate 200, the second circuit section 24 and the shield layer 6 can be easily electrically insulated and separated from each other.

Embodiment 3

Figure 12:
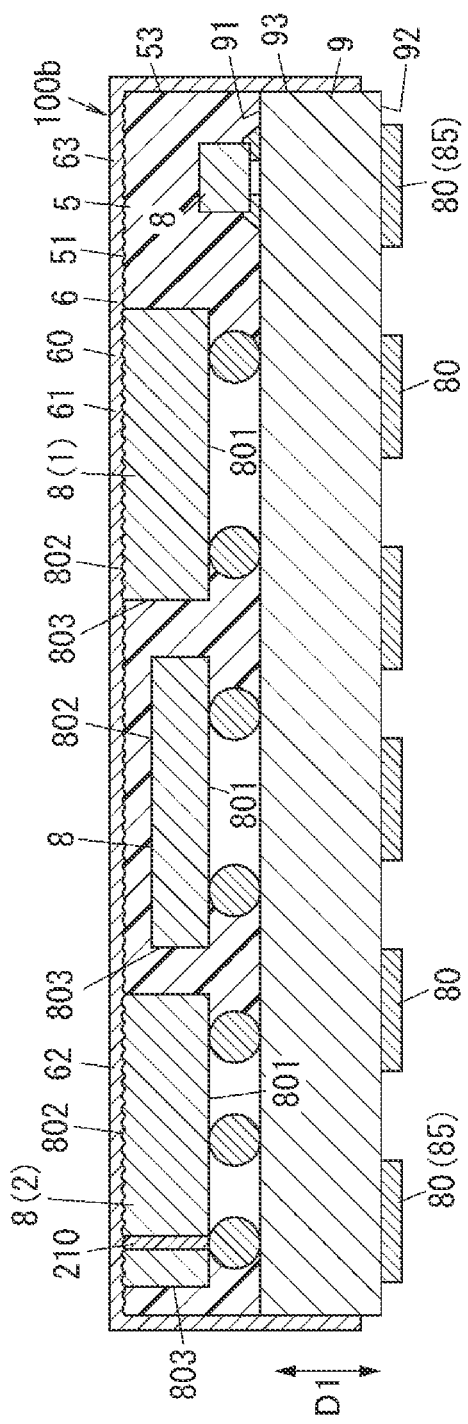
FIG. 12 is a cross-sectional view of a radio frequency module according to Embodiment 3.

A radio frequency module 100b according to Embodiment 3 will be described with reference to FIG. 12. Regarding the radio frequency module 100b according to Embodiment 3, constituent elements similar to those of the radio frequency module 100a according to Embodiment 2 are denoted by the same reference signs, and description thereof will be omitted. Note that a circuit configuration of the radio frequency module 100b is similar to the circuit configuration of the radio frequency module 100 according to Embodiment 1 described with reference to FIG. 4.

In the radio frequency module 100b according to Embodiment 3, an IC chip constituting the second electronic component 2 includes a through-electrode 210 penetrating the second substrate 20 in a thickness direction of the second substrate 20. The through-electrode 210 is, for example, a through silicon via (TSV). An electrically insulating portion is interposed between the through-electrode 210 and the second substrate 20. A material of the electrically insulating portion is, for example, silicon oxide. The through-electrode 210 has, for example, a cylindrical shape having a first end and a second end. The first end of the through-electrode 210 is connected to the second pad electrode 26 connected to the ground layer of the mounting substrate 9 among the plurality of second pad electrodes 26 (see FIG. 10) connected to the second circuit section 24 (see FIG. 10) in the second electronic component 2. The second end of the through-electrode 210 is in contact with the shield layer 6.

In the radio frequency module 100b according to Embodiment 3, similar to the radio frequency module 100a according to Embodiment 2, the shield layer 6 is in contact with the second main surface 12 of the first substrate 10 and the second main surface 22 of the second substrate 20. Thus, it is possible to improve the heat dissipation.

In addition, in the radio frequency module 100b according to Embodiment 3, since the second electronic component 2 includes the through-electrode 210, it is possible to improve the grounding performance of the second circuit section 24 of the second electronic component 2.

Embodiment 4

Figure 13:
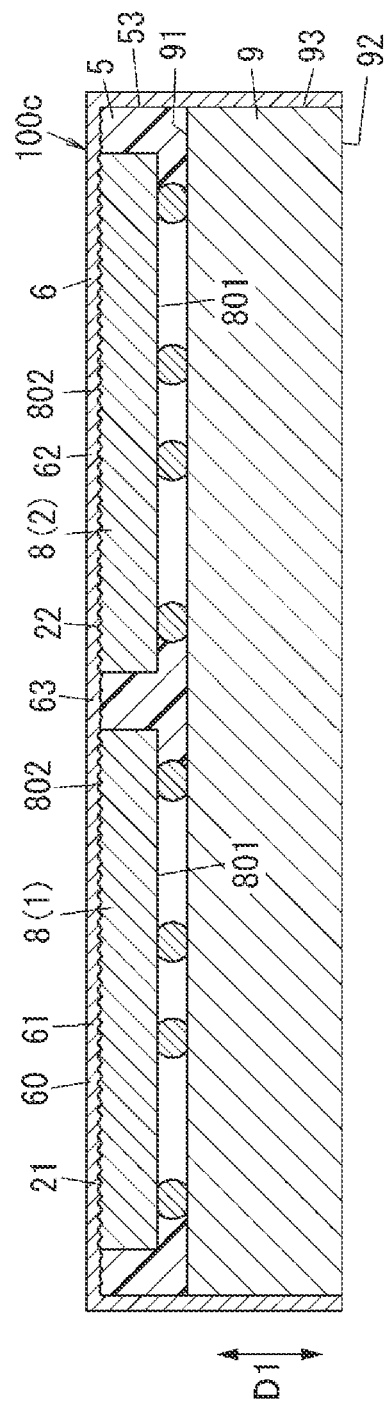
FIG. 13 is a cross-sectional view of a radio frequency module according to Embodiment 4.

A radio frequency module 100c according to Embodiment 4 will be described with reference to FIG. 13. Regarding the radio frequency module 100c according to Embodiment 4, constituent elements similar to those of the radio frequency module 100 according to Embodiment 1 are denoted by the same reference signals, and description thereof will be omitted. In FIG. 13, illustration of the plurality of external connection terminals 80 (see FIG. 1) is omitted. Note that a circuit configuration of the radio frequency module 100c is similar to the circuit configuration of the radio frequency module 100 according to Embodiment 1 described with reference to FIG. 4.

In the radio frequency module 100c according to Embodiment 4, the first electronic component 1 is, for example, the duplexer 132A (see FIG. 4) including the transmission filter 112A and the reception filter 122A. Also, in a radio frequency module 100d, the second electronic component 2 is the duplexer 132B (see FIG. 4) including the transmission filter 112B and the reception filter 122B. Thus, it is possible to reduce an area of the first main surface 91 of the mounting substrate 9 in the radio frequency module 100c according to Embodiment 4 as compared with the radio frequency module 100 according to Embodiment 1, and to reduce the size of the module in a view from the thickness direction D1 of the mounting substrate 9.

In the radio frequency module 100c according to Embodiment 4, similar to the radio frequency module 100 according to Embodiment 1, since the shield layer 6 is in contact with the second main surface 12 of the first substrate 10 (see FIG. 2) and the second main surface 22 of the second substrate 20 (see FIG. 2), it is possible to improve the heat dissipation.

Embodiment 5

Figure 14:
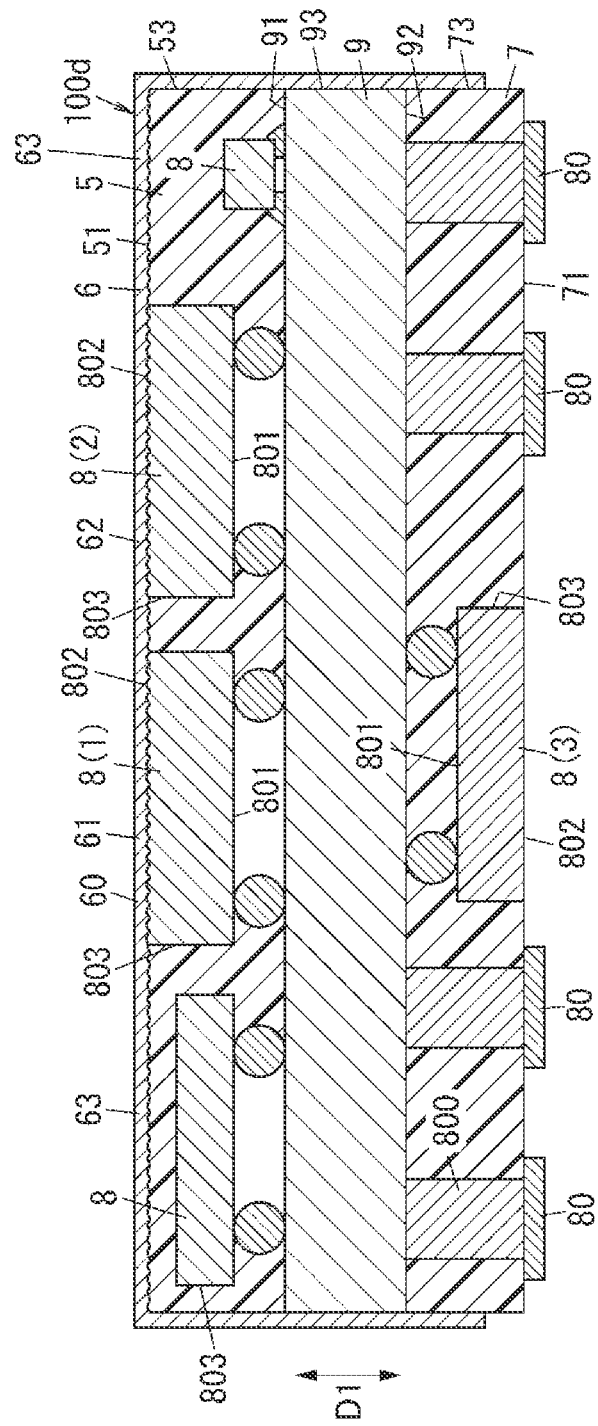
FIG. 14 is a cross-sectional view of a radio frequency module according to Embodiment 5.

A radio frequency module 100d according to Embodiment 5 will be described with reference to FIG. 14. Regarding the radio frequency module 100d according to Embodiment 5, constituent elements similar to those of the radio frequency module 100 according to Embodiment 1 are denoted by the same reference signs, and description thereof will be omitted. Note that a circuit configuration of the radio frequency module 100d is similar to the circuit configuration of the radio frequency module 100 according to Embodiment 1 described with reference to FIG. 4.

The radio frequency module 100d according to Embodiment 5 is different from the radio frequency module 100 according to Embodiment 1 in that the plurality of electronic components 8 include a third electronic component 3 disposed over the second main surface 92 of the mounting substrate 9. Thus, it is possible to reduce the size of the radio frequency module 100d according to Embodiment 5 in a view from the thickness direction D1 of the mounting substrate 9 as compared with the radio frequency module 100 according to Embodiment 1.

Further, the radio frequency module 100d is different from the radio frequency module 100 according to Embodiment 1 in that each of the plurality of external connection terminals 80 includes a columnar electrode 800. Here, the columnar electrode 800 is, for example, a cylindrical electrode.

The radio frequency module 100d further includes a resin layer 7. The resin layer 7 covers an outer peripheral surface 803 of the third electronic component 3 disposed over the second main surface 92 of the mounting substrate 9 and outer peripheral surfaces of the columnar electrodes 800.

The resin layer 7 is formed so as to expose the second main surface 802 of the electronic component 8 constituting the third electronic component 3. The resin layer 7 contains resin (for example, epoxy resin). The resin layer 7 may contain a filler in addition to the resin. The material of the resin layer 7 may be the same as or different from the material of the resin layer 5.

In the radio frequency module 100d, the shield layer 6 also covers an outer peripheral surface 73 of the resin layer 7.

In addition, in the radio frequency module 100d, the second main surface 802 of the electronic component 8 disposed over the second main surface 92 of the mounting substrate 9 is substantially flush with a main surface 71 of the resin layer 7 on the side opposite to the mounting substrate 9 side.

In the radio frequency module 100d according to Embodiment 5, similar to the radio frequency module 100 according to Embodiment 1, the shield layer 6 is in contact with the second main surface 12 of the first substrate 10 (see FIG. 2) and the second main surface 22 of the second substrate 20 (see FIG. 2). Thus, it is possible to improve the heat dissipation.

Further, in the radio frequency module 100d according to Embodiment 5, since the resin layer 7 is formed so as to expose the second main surface 802 of the third electronic component 3, it is possible to suppress an increase in temperature of the third electronic component 3. Further, it is possible to reduce the height of the radio frequency module 100d according to Embodiment 5 due to a configuration in which the electronic component 8 is also disposed over the second main surface 92 of the mounting substrate 9.

Embodiment 6

Figure 15:
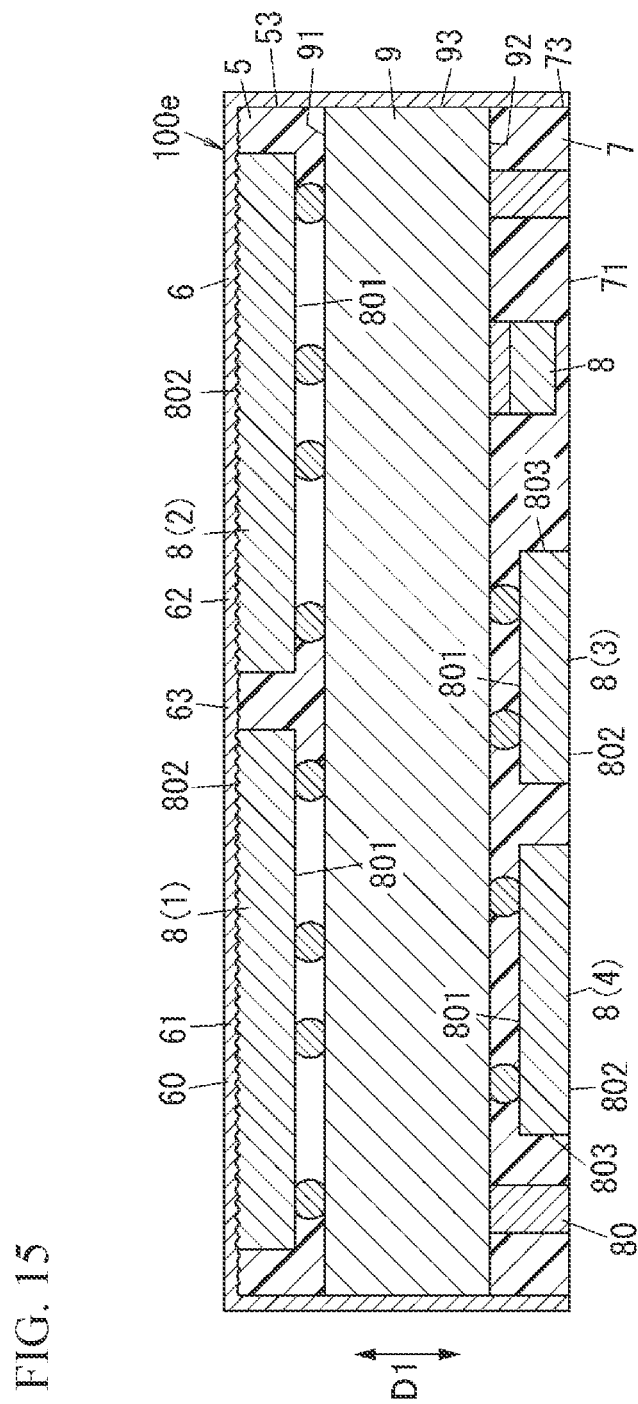
FIG. 15 is a cross-sectional view of a radio frequency module according to Embodiment 6.
Figure 16:
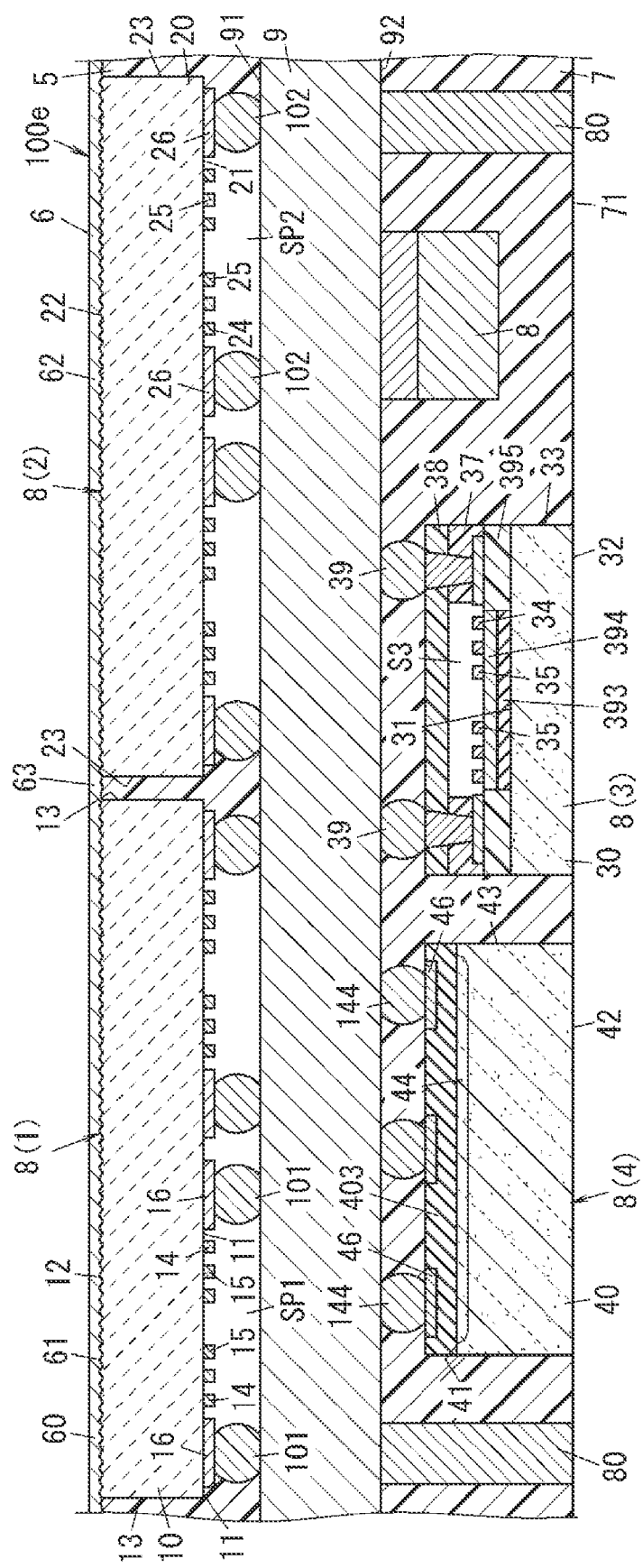
FIG. 16 is an enlarged cross-sectional view of a part of the above-described radio frequency module.

A radio frequency module 100e according to Embodiment 6 will be described with reference to FIGS. 15 and 16. Regarding the radio frequency module 100e according to Embodiment 6, constituent elements similar to those of the radio frequency module 100d according to Embodiment 5 are denoted by the same reference signs, and description thereof will be omitted. Note that a circuit configuration of the radio frequency module 100e is similar to the circuit configuration of the radio frequency module 100 according to Embodiment 1 described with reference to FIG. 4, but each of the number of selection terminals of the first switch 104 and the number of reception filters is increased by one.

In the radio frequency module 100e according to Embodiment 6, the first electronic component 1 is, for example, the duplexer 132A (see FIG. 4) including the transmission filter 112A and the reception filter 122A. In addition, in the radio frequency module 100e, the second electronic component 2 is the duplexer 132B (see FIG. 4) including the transmission filter 112B and the reception filter 122B. Thus, it is possible to reduce an area of the first main surface 91 of the mounting substrate 9 in the radio frequency module 100e according to Embodiment 6 as compared with the radio frequency module 100d according to Embodiment 5, and to reduce the size of the module in a view from the thickness direction D1 of the mounting substrate 9.

In addition, in the radio frequency module 100e according to Embodiment 6, the plurality of electronic components 8 include the third electronic component 3 and a fourth electronic component 4 that are disposed over the second main surface 92 of the mounting substrate 9.

The third electronic component 3 includes a third substrate 30 and a third circuit section 34. The third substrate 30 has a first main surface 31 and a second main surface 32 that are opposed to each other. The third circuit section 34 is formed on the first main surface 31 side of the third substrate 30.

The third electronic component 3 is a reception filter different from the reception filters 122A and 122B. Here, the third electronic component 3 is an acoustic wave filter. In the acoustic wave filter constituting the third electronic component 3, the third substrate 30 is a silicon substrate. The third circuit section 34 includes a plurality of IDT electrodes 35. Here, the acoustic wave filter constituting the third electronic component 3 includes a low-acoustic-velocity film 393 provided on the first main surface 31 of the third substrate 30, a piezoelectric layer 394 provided on the low-acoustic-velocity film 393, and the plurality of IDT electrodes 35 provided on the piezoelectric layer 394. Thus, the third circuit section 34 includes the plurality of IDT electrodes 35.

A material of the piezoelectric layer 394 is, for example, lithium niobate or lithium tantalate. The low-acoustic-velocity film 393 is a film in which an acoustic velocity of a bulk wave propagating through the low-acoustic-velocity film 393 is lower than an acoustic velocity of a bulk wave propagating through the piezoelectric layer 394. A material of the low-acoustic-velocity film 393 is, for example, silicon oxide, but is not limited thereto. The material of the low-acoustic-velocity film 393 may be, for example, silicon oxide, glass, silicon oxynitride, tantalum oxide, a compound obtained by adding fluorine, carbon, or boron to silicon oxide, or a material containing any of these materials as a main component. In the third substrate 30, an acoustic velocity of a bulk wave propagating through the third substrate 30 is higher than an acoustic velocity of an acoustic wave propagating through the piezoelectric layer 394. Here, the bulk wave propagating through the third substrate 30 is a bulk wave having the lowest acoustic velocity among a plurality of bulk waves propagating through the third substrate 30.

The third electronic component 3 may further include a high-acoustic-velocity film provided between the third substrate 30 and the low-acoustic-velocity film 393. The high-acoustic-velocity film is a film in which an acoustic velocity of a bulk wave propagating through the high-acoustic-velocity film is higher than the acoustic velocity of the acoustic wave propagating through the piezoelectric layer 394. A material of the high-acoustic-velocity film is, for example, at least one material selected from the group consisting of diamond-like carbon, aluminum nitride, aluminum oxide, silicon carbide, silicon nitride, silicon, sapphire, a piezoelectric material (lithium tantalate, lithium niobate, or crystal), alumina, zirconia, cordierite, mullite, steatite, forsterite, magnesia, and diamond. The material of the high-acoustic-velocity film may be a material containing any one of the materials described above as a main component, or a material containing a mixture containing any one of the materials described above as a main component.

The low-acoustic-velocity film 393 is positioned away from an outer edge of the third substrate 30 in a plan view from a thickness direction of the third substrate 30. The third electronic component 3 further includes an insulating layer 395 that covers a region of the first main surface 31 of the third substrate 30 that is not covered with the low-acoustic-velocity film 393. The insulating layer 395 has an electrical insulation property. The insulating layer 395 is formed along the outer edge of the third substrate 30 on the first main surface 31 of the third substrate 30. The insulating layer 395 surrounds the plurality of IDT electrodes 35. In a plan view from the thickness direction of the third substrate 30, the insulating layer 395 has a frame shape (for example, a rectangular frame shape). A part of the insulating layer 395 overlaps an outer peripheral portion of the piezoelectric layer 394 in the thickness direction of the third substrate 30. An outer peripheral surface of the piezoelectric layer 394 and an outer peripheral surface of the low-acoustic-velocity film 393 are covered with the insulating layer 395. A material of the insulating layer 395 is epoxy resin, polyimide, or the like.

The third electronic component 3 includes a third spacer layer 37, a third cover member 38, and a plurality of third terminals 39 as constituent elements of a third package structure.

The third spacer layer 37 and the third cover member 38 are provided on the first main surface 31 side of the third substrate 30. The third spacer layer 37 surrounds the plurality of IDT electrodes 35 in a plan view from the thickness direction D1 of the mounting substrate 9. In a plan view from the thickness direction D1 of the mounting substrate 9, the third spacer layer 37 has a rectangular frame shape. The third spacer layer 37 has an electrical insulation property. A material of the third spacer layer 37 is epoxy resin, polyimide, or the like. The third cover member 38 has a flat plate shape. The third cover member 38 is disposed on the third spacer layer 37 so as to face the third substrate 30 in the thickness direction D1 of the mounting substrate 9. The third cover member 38 overlaps the plurality of IDT electrodes 35 in the thickness direction D1 of the mounting substrate 9, and is separated from the plurality of IDT electrodes 35 in the thickness direction D1 of the mounting substrate 9. The third cover member 38 has an electrical insulation property. A material of the third cover member 38 is epoxy resin, polyimide, or the like. The third electronic component 3 has a third space S3 surrounded by the third substrate 30, the insulating layer 395, the third spacer layer 37, and the third cover member 38. In the third electronic component 3, gas is contained in the third space S3. The gas is air, an inert gas (for example, nitrogen gas), or the like. The plurality of third terminals 39 are exposed from the third cover member 38. Each of the plurality of third terminals 39 is, for example, a bump. Each bump is, for example, a solder bump. Each bump is not limited to a solder bump and may be, for example, a gold bump.

The fourth electronic component 4 includes a fourth substrate 40 and a fourth circuit section 44. The fourth substrate 40 has a first main surface 41 and a second main surface 42 that are opposed to each other. The fourth circuit section 44 is formed on the first main surface 41 side of the fourth substrate 40. Here, the fourth substrate 40 is, for example, a silicon substrate. The fourth electronic component 4 is an IC chip. The IC chip constituting the fourth electronic component 4 is, for example, the low-noise amplifier 121 (see FIG. 4), but is not limited thereto, and may be, for example, an IC chip including at least one of the first switch 104, the second switch 105, and the third switch 106.

In addition, in the radio frequency module 100e according to Embodiment 6, a multilayer structure portion 403 including a wiring layer and a passivation film is provided on the first main surface 41 of the fourth substrate 40 in the fourth electronic component 4. Additionally, in the radio frequency module 100e according to Embodiment 6, in the fourth electronic component 4, the plurality of fourth pad electrodes 46 connected to the fourth circuit section 44 through the wiring layer and the like of the multilayer structure portion 403 are exposed from the multilayer structure portion 403. Further, the radio frequency module 100e according to Embodiment 6 further includes a plurality of fourth bumps 144 bonded to the plurality of fourth pad electrodes 46 and the mounting substrate 9.

Further, in the radio frequency module 100e according to Embodiment 6, each of the plurality of external connection terminals 80 is a columnar electrode. Here, the columnar electrode is, for example, a cylindrical electrode. The resin layer 7 covers an outer peripheral surface 33 of the third electronic component 3 disposed over the second main surface 92 of the mounting substrate 9, an outer peripheral surface 43 of the fourth electronic component 4 disposed over the second main surface 92 of the mounting substrate 9, and outer peripheral surfaces of the plurality of external connection terminals 80 disposed on the second main surface 92 of the mounting substrate 9.

The resin layer 7 is formed so as to expose the second main surface 32 of the third substrate 30 and the second main surface 42 of the fourth substrate 40.

Further, in the radio frequency module 100e, the second main surface 32 of the third substrate 30 and the second main surface 42 of the fourth substrate 40 are substantially flush with the main surface 71 of the resin layer 7 on the side opposite to the mounting substrate 9 side.

In the radio frequency module 100e according to Embodiment 6, the shield layer 6 is in contact with the second main surface 12 of the first substrate 10 and the second main surface 22 of the second substrate 20, similar to the radio frequency module 100 according to Embodiment 1. Thus, it is possible to improve the heat dissipation.

Further, in the radio frequency module 100e according to Embodiment 6, at least a part of each of the second main surface 32 of the third substrate 30 and the second main surface 42 of the fourth substrate 40 is exposed. The material of the third substrate 30 and the material of the fourth substrate 40 are the same. The phrase "the material of the third substrate 30 and the material of the fourth substrate 40 are the same" means that the main component of the third substrate 30 and the main component of the fourth substrate 40 are the same. The main component does not contain impurities. For example, when each of the third substrate 30 and the fourth substrate 40 is a silicon substrate, the main component of each of the third substrate 30 and the fourth substrate 40 is silicon, and even when impurities are added to the silicon substrate, the main component does not contain the impurities. The third substrate 30 is a silicon substrate, but may include a natural oxide film (silicon oxide film) having a thickness of about from 20 nm to 100 nm on the second main surface 32 side. In this case, the phrase "the second main surface 32 of the third substrate 30 is exposed" includes that the silicon oxide film is exposed. The fourth substrate 40 is a silicon substrate, but may include a natural oxide film (silicon oxide film) having a thickness of about from 20 nm to 100 nm on the second main surface 42 side. In this case, the phrase "the second main surface 42 of the fourth substrate 40 is exposed" includes that the silicon oxide film is exposed.

The radio frequency module 100e according to Embodiment 6 can suppress an increase in temperature of the third electronic component 3 and the fourth electronic component 4. Further, it is possible to reduce the height of the radio frequency module 100e according to Embodiment 6 due to the configuration in which the electronic components 8 are also disposed over the second main surface 92 of the mounting substrate 9.

In addition, the radio frequency module 100e according to Embodiment 6 has an advantage that when the third substrate 30 and the fourth substrate 40 are ground from the side opposite to the mounting substrate 9 side, for example, in manufacturing, grinding is easily performed, because the material of the third substrate 30 and the material of the fourth substrate 40 are the same. However, it is not essential to grind the third substrate 30 and the fourth substrate 40.

(Modification 1 of Embodiment 6)

Figure 17:
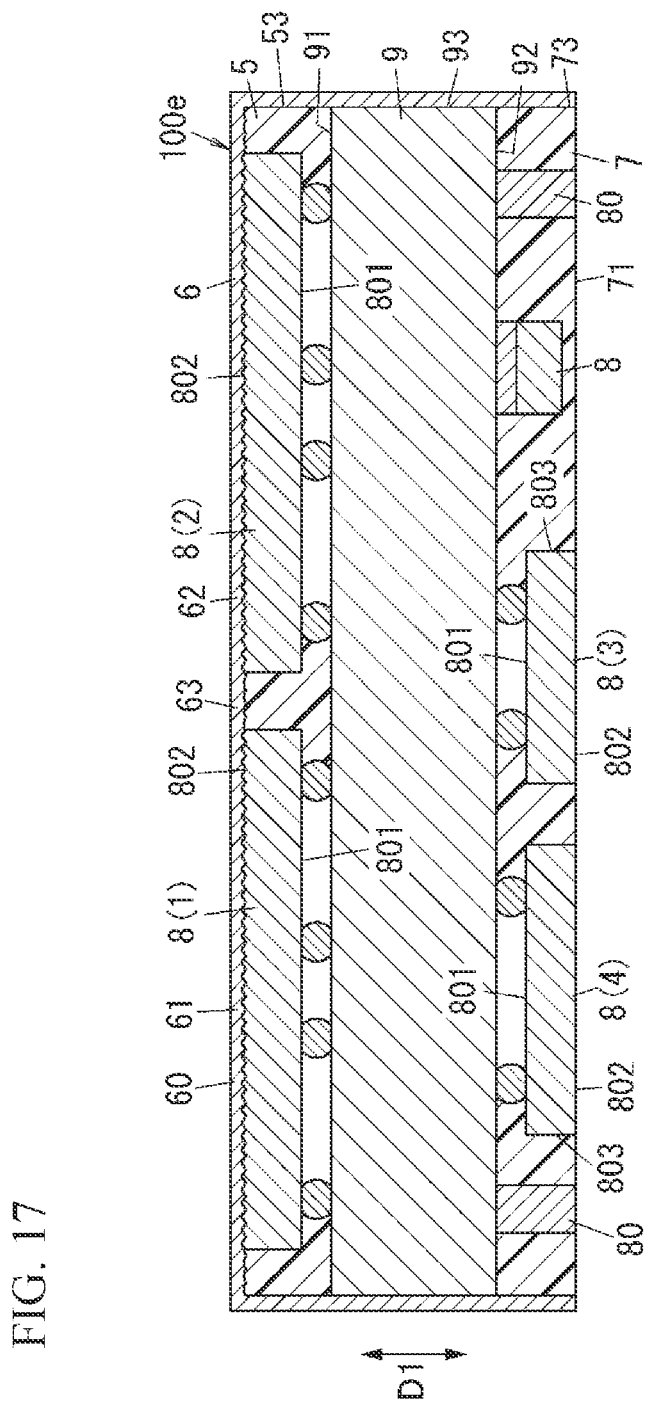
FIG. 17 is a cross-sectional view of a radio frequency module according to Modification 1 of Embodiment 6.
Figure 18:
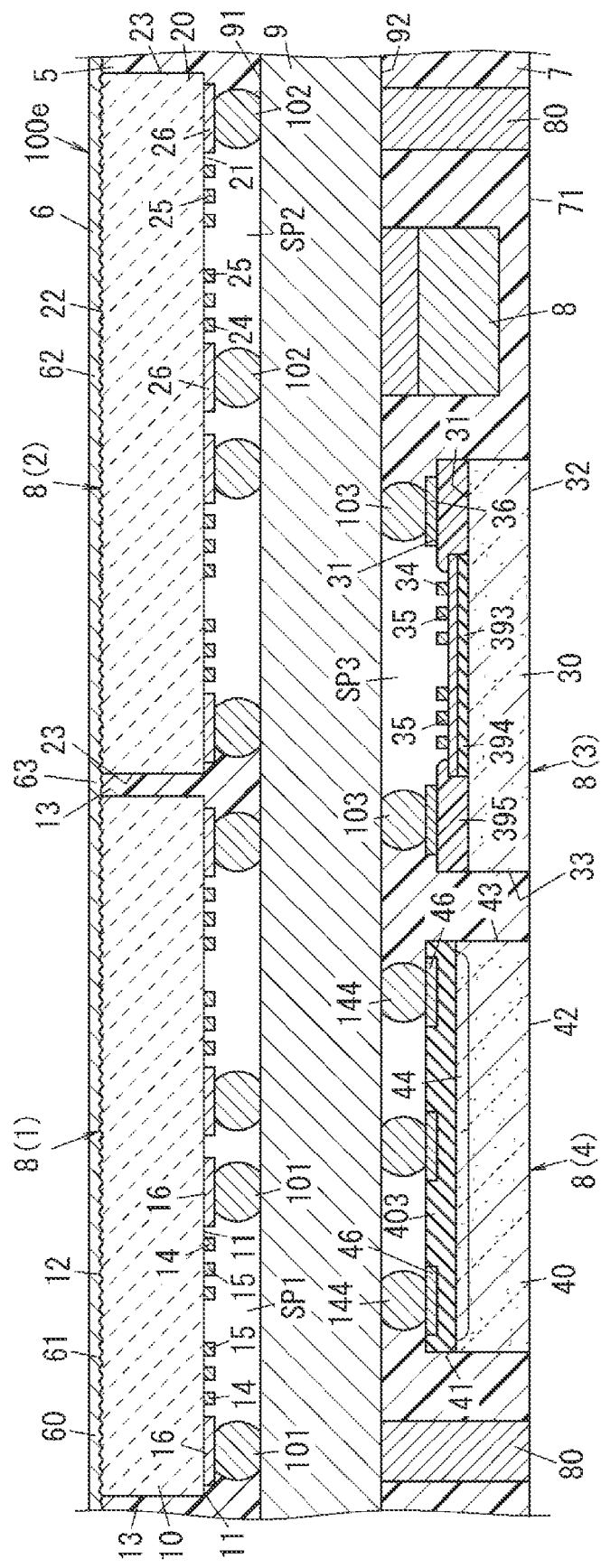
FIG. 18 is an enlarged cross-sectional view of a part of the above-described radio frequency module.

A radio frequency module 100e according to Modification 1 of Embodiment 6 will be described with reference to FIGS. 17 and 18. Regarding the radio frequency module 100e according to Modification 1 of Embodiment 6, constituent elements similar to those of the radio frequency module 100e according to Embodiment 6 are denoted by the same reference signs, and description thereof will be omitted.

The radio frequency module 100e according to Modification 1 is different from the radio frequency module 100e according to Embodiment 6 in that the third electronic component 3 is an acoustic wave filter of a bare chip.

In the radio frequency module 100e according to Modification 1, a plurality of third pad electrodes 36 are formed on the insulating layer 395 of the third electronic component 3. Additionally, the radio frequency module 100e according to Modification 1 further includes a plurality of third bumps 103 bonded to the plurality of third pad electrodes 36 and the mounting substrate 9. In the radio frequency module 100e, the plurality of IDT electrodes 35 of the acoustic wave filter of the bare chip constituting the third electronic component 3 are disposed in a third space SP3 formed between the third substrate 30 and the mounting substrate 9 by the plurality of third pad electrodes 36, the plurality of third bumps 103, the third substrate 30, the mounting substrate 9, and the resin layer 7.

In the radio frequency module 100e according to Modification 1, since it is possible to reduce the height of the third electronic component 3 compared to the radio frequency module 100e according to Embodiment 6, it is possible to reduce the height of the radio frequency module 100e as a whole.

(Modification 2 of Embodiment 6)

Figure 19:
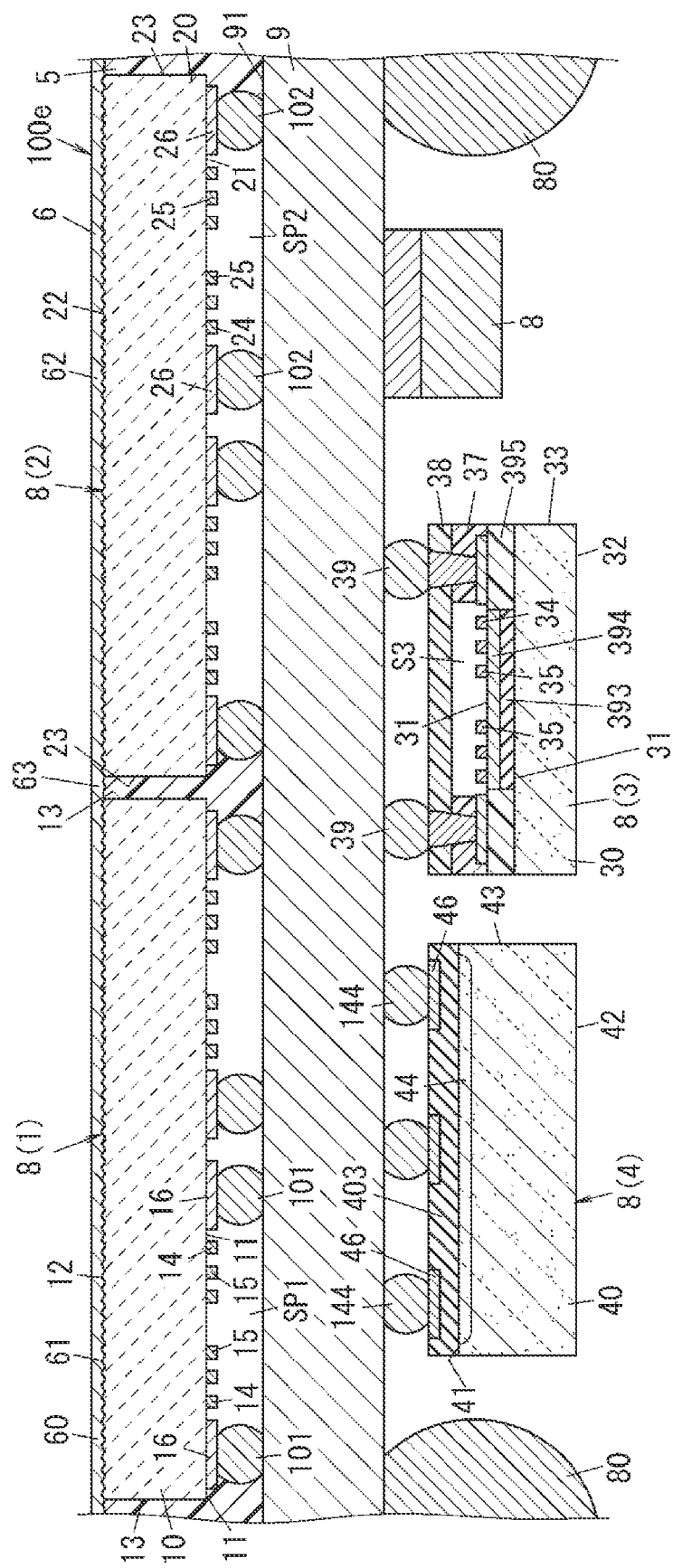
FIG. 19 is an enlarged cross-sectional view of a part of a radio frequency module according to Modification 2 of Embodiment 6.

A radio frequency module 100e according to Modification 2 of Embodiment 6 will be described with reference to FIG. 19. Regarding the radio frequency module 100e according to Modification 2 of Embodiment 6, constituent elements similar to those of the radio frequency module 100e according to Embodiment 6 are denoted by the same reference signs, and description thereof will be omitted.

The radio frequency module 100e according to Modification 2 is different from the radio frequency module 100e according to Embodiment 6 in that the plurality of external connection terminals 80 are ball bumps. Further, the radio frequency module 100e according to Modification 2 is different from the radio frequency module 100e according to Embodiment 6 in that the radio frequency module 100e according to Modification 2 does not include the resin layer 7 of the radio frequency module 100e according to Embodiment 6. The radio frequency module 100e according to Modification 2 may include an underfill portion provided in a space between the fourth electronic component 4 and the second main surface 92 of the mounting substrate 9.

A material of the ball bump constituting each of the plurality of external connection terminals 80 is, for example, gold, copper, solder, or the like.

The plurality of external connection terminals 80 may include an external connection terminal 80 constituted by the ball bump and an external connection terminal 80 constituted by the columnar electrode in a mixed manner.

In the radio frequency module 100e according to Modification 2 of Embodiment 6, the material of the first substrate 10 and the material of the second substrate 20 are the same, similar to the radio frequency module 100e according to Embodiment 6. Further, the shield layer 6 is in contact with the second main surface 12 of the first substrate 10 and the second main surface 22 of the second substrate 20. Thus, the radio frequency module 100e according to Modification 2 of Embodiment 6 improves the heat dissipation, similar to the radio frequency module 100e according to Embodiment 6.

In the radio frequency module 100e according to Embodiment 6, the entire region of the second main surface 32 of the third substrate 30 in the third electronic component 3 and the entire region of the second main surface 42 of the fourth substrate 40 in the fourth electronic component 4 are not necessarily exposed, and only a part of the second main surface 32 and a part of the second main surface 42 may be exposed.

Each of the above-described Embodiments 1 to 6 and the like is merely one of various embodiments of the present disclosure. The above-described Embodiments 1 to 6 and the like can be variously modified according to design and the like as long as the object of the present disclosure can be achieved.

The BAW filter constituting each of the first electronic component 1 and the second electronic component 2 that have been described above includes an element of a package structure, but is not limited thereto, and may be a BAW filter of a bare chip. Further, in the BAW filter, when each of the first BAW resonator 180 and the second BAW resonator 280 is an FBAR, the structure is not limited to that illustrated in FIG. 7. For example, instead of forming the cavity 184 in the first substrate 10, the first BAW resonator 180 may be disposed such that a cavity is formed between a part of the electrically insulating film 185 and the first main surface 11 of the first substrate 10. In this case, the structure in which the first electrode 181 is formed on the side opposite to the cavity side in the electrically insulating film 185, the piezoelectric film 182 is formed on the first electrode 181, and the second electrode 183 is formed on the piezoelectric film 182 may be adopted. The cavity between a part of the electrically insulating film 185 and the first main surface 11 of the first substrate 10 can be formed by using, for example, a sacrificial layer etching technique. Additionally, instead of forming the cavity 284 in the second substrate 20, the second BAW resonator 280 may be disposed such that a cavity is formed between a part of the electrically insulating film 285 and the first main surface 21 of the second substrate 20. In this case, the structure in which the first electrode 281 is formed on the side opposite to the cavity side in the electrically insulating film 285, the piezoelectric film 282 is formed on the first electrode 281, and the second electrode 283 is formed on the piezoelectric film 282 may be adopted. The cavity between a part of the electrically insulating film 285 and the first main surface 21 of the second substrate 20 can be formed by using, for example, a sacrificial layer etching technique.

In addition, the filters such as the transmission filters 112A and 112B, the reception filters 122A and 122B and the like are not limited to ladder filters, and may be longitudinally coupled resonator-type surface acoustic wave filters, for example.

Further, the above-described acoustic wave filter is an acoustic wave filter using a surface acoustic wave or a bulk acoustic wave, but is not limited thereto, and may be, for example, an acoustic wave filter using a boundary acoustic wave, a plate wave, or the like.

Each of the plurality of first bumps 101, the plurality of second bumps 102, the plurality of third bumps 103, and the plurality of fourth bumps 144 is, for example, a solder bump, but is not limited thereto, and may be, for example, a gold bump.

The electronic components 8 other than the first electronic component 1 and the second electronic component 2 among the plurality of electronic components 8 are not necessarily electrically connected to the mounting substrate 9 through the bumps, and may be electrically connected to the mounting substrate 9 through bonding wires, for example.

The circuit configurations of the radio frequency modules 100 to 100e are not limited to the above-described examples. In addition, each of the radio frequency modules 100 to 100e may include, for example, a radio frequency front end circuit compatible with Multi Input Multi Output (MIMO) as the circuit configuration.

Additionally, the communication device 300 according to Embodiment 1 may include any one of the radio frequency modules 100a, 100b, 100c, 100d, and 100e instead of the radio frequency module 100.

(Aspects)

The following aspects are disclosed herein.

A radio frequency module (100; 100a; 100b; 100c; 100d; 100e) according to a first aspect includes a mounting substrate (9), a first electronic component (1) and a second electronic component (2), a resin layer (5), and a shield layer (6). The mounting substrate (9) has a first main surface (91) and a second main surface (92) that are opposed to each other. The first electronic component (1) and the second electronic component (2) are disposed over the first main surface (91) of the mounting substrate (9). The resin layer (5) is disposed on the first main surface (91) of the mounting substrate (9), and covers an outer peripheral surface (13) of the first electronic component (1) and an outer peripheral surface (23) of the second electronic component (2). The shield layer (6) covers the resin layer (5), the first electronic component (1), and the second electronic component (2). The first electronic component (1) includes a first substrate (10) having a first main surface (11) and a second main surface (12) that are opposed to each other, and a first circuit section (14) formed on the first main surface (11) side of the first substrate (10). The second electronic component (2) includes a second substrate (20) having a first main surface (21) and a second main surface (22) that are opposed to each other, and a second circuit section (24) formed on the first main surface (21) side of the second substrate (20). A material of the first substrate (10) and a material of the second substrate (20) are the same. The shield layer (6) is in contact with the second main surface (12) of the first substrate (10) and the second main surface (22) of the second substrate (20).

The radio frequency module (100; 100a; 100b; 100c; 100d; 100e) according to the first aspect can improve the heat dissipation.

In a radio frequency module (100) according to a second aspect, each of the first electronic component (1) and the second electronic component (2) in the first aspect is an acoustic wave filter. Each of the first substrate (10) and the second substrate (20) may be a lithium niobate substrate or a lithium tantalate substrate.

The radio frequency module (100) according to the second aspect can suppress an increase in temperature of the acoustic wave filter constituting each of the first electronic component (1) and the second electronic component (2), and can stabilize the characteristics thereof.

In a radio frequency module (100) according to a third aspect, each of the first electronic component (1) and the second electronic component (2) in the first aspect is an acoustic wave filter. Each of the first substrate (10) and the second substrate (20) is a silicon substrate.

The radio frequency module (100) according to the third aspect can improve the filter performance of each of the first electronic component (1) and the second electronic component (2).

In a radio frequency module (100; 100a; 100b; 100c; 100d; 100e) according to a fourth aspect, each of the first electronic component (1) and the second electronic component (2) in the first aspect is an acoustic wave filter of a bare chip.

It is possible to reduce the heights of the first electronic component (1) and the second electronic component (2) in the radio frequency module (100; 100a; 100b; 100c; 100d; 100e) according to the fourth aspect, and to reduce the height of the radio frequency module (100; 100a; 100b; 100c; 100d; 100e) as a whole.

In a radio frequency module (100; 100a; 100b) according to a fifth aspect, the acoustic wave filter constituting the first electronic component (1) in any one of the second to fourth aspects is a transmission filter (112B) constituting a duplexer (132B). The acoustic wave filter constituting the second electronic component (2) is a reception filter (122B) constituting the duplexer (132B).

The radio frequency module (100; 100a; 100b) according to the fifth aspect can suppress the deterioration in characteristics due to an increase in temperature of the transmission filter (112B) and the reception filter (122B).

In a radio frequency module (100; 100a) according to a sixth aspect, each of the first substrate (10) and the second substrate (20) in the first aspect is a silicon substrate.

The radio frequency module (100; 100a) according to the sixth aspect have many options of the types of devices for each of the first electronic component (1) and the second electronic component (2). Further, in the radio frequency module (100; 100a) according to the sixth aspect, when a manufacturing process in which the first substrate (10) and the second substrate (20) are ground is adopted, the grinding can be easily performed.

In a radio frequency module (100a) according to a seventh aspect, the first electronic component (1) in the sixth aspect is an acoustic wave filter. The second electronic component (2) is an IC chip.

In a radio frequency module (100a) according to an eighth aspect, the IC chip in the seventh aspect includes a power amplifier (111).

The radio frequency module (100a) according to the eighth aspect can easily dissipate the heat generated in the power amplifier (111) through the shield layer (6).

In a radio frequency module (100a) according to a ninth aspect, the IC chip in the seventh aspect is a controller (115) configured to control the power amplifier (111).

The radio frequency module (100a) according to the ninth aspect can easily dissipate the heat generated in the controller (115) through the shield layer (6).

In a radio frequency module (100a; 100b) according to a tenth aspect, the IC chip in the seventh aspect includes a low-noise amplifier (121).

The radio frequency module (100a; 100b) according to the tenth aspect can easily dissipate the heat generated in the low-noise amplifier (121) through the shield layer (6).

In a radio frequency module (100a; 100b) according to an eleventh aspect, the IC chip in the seventh or ninth aspect includes a switch (a first switch 104; a second switch 105; a third switch 106).

The radio frequency module (100a; 100b) according to the eleventh aspect can easily dissipate the heat generated in the switch (the first switch 104; the second switch 105; the third switch 106) through the shield layer (6).

In a radio frequency module (100*b*) according to a twelfth aspect, the IC chip in any one of the seventh to eleventh aspects includes a through-electrode (210) penetrating the second substrate (20) in a thickness direction of the second substrate (20).

The radio frequency module (100*b*) according to the twelfth aspect can improve the grounding performance of the IC chip.

A radio frequency module (100; 100*a*; 100*b*; 100*c*; 100*d*; 100*e*) according to a thirteenth aspect further includes, in any one of the first to twelfth aspects, an electronic component (8) disposed over the first main surface (91) of the mounting substrate (9) and covered with the resin layer (5). A maximum roughness in height of each of the second main surface (12) of the first substrate (10) and the second main surface (22) of the second substrate (20) is larger than a maximum roughness in height of a main surface (second main surface 802), on a side opposite to the mounting substrate (9) side, of the electronic component (8) covered with the resin layer (5).

The radio frequency module (100; 100*a*; 100*b*; 100*c*; 100*d*; 100*e*) according to the thirteenth aspect can improve the adhesion between the shield layer (6), and the first electronic component (1) and the second electronic component (2).

In a radio frequency module (100; 100*a*; 100*b*; 100*c*; 100*d*; 100*e*) according to a fourteenth aspect, the shield layer (6) in any one of the first to twelfth aspects has a recognition mark (60). The recognition mark (60) includes a first portion (61) and a second portion (62). The first portion (61) is a portion of the shield layer (6) overlapping the second main surface (12) of the first substrate (10) in a thickness direction (D1) of the mounting substrate (9). The second portion (62) is a portion of the shield layer (6) overlapping the second main surface (22) of the second substrate (20) in the thickness direction (D1) of the mounting substrate (9).

In the radio frequency module (100; 100*a*; 100*b*; 100*c*; 100*d*; 100*e*) according to the fourteenth aspect, a person can visually recognize the recognition mark (60).

A radio frequency module (100*d*; 100*e*) according to a fifteenth aspect further includes, in any one of the first to fourteenth aspects, a third electronic component (3). The third electronic component (3) is disposed over the second main surface (92) of the mounting substrate (9).

It is possible to reduce the size of the radio frequency module (100*d*; 100*e*) according to the fifteenth aspect in a view from a thickness direction (D1) of the mounting substrate (9).

A radio frequency module (100*e*) according to a sixteenth aspect further includes, in the fifteenth aspect, a fourth electronic component (4). The fourth electronic component (4) is disposed over the second main surface (92) of the mounting substrate (9). The third electronic component (3) includes a third substrate (30) having a first main surface (31) and a second main surface (32) that are opposed to each other, and a third circuit section (34) formed on the first main surface (31) side of the third substrate (30). The fourth electronic component (4) includes a fourth substrate (40) having a first main surface (41) and a second main surface (42) that are opposed to each other, and a fourth circuit section (44) formed on the first main surface (41) side of the fourth substrate (40). At least a part of each of the second main surface (32) of the third substrate (30) and the second main surface (42) of the fourth substrate (40) is exposed. A material of the third substrate (30) and a material of the fourth substrate (40) are the same.

It is possible to reduce the size of the radio frequency module (100*e*) according to the sixteenth aspect in a view from a thickness direction (D1) of the mounting substrate (9).

A radio frequency module (100; 100*a*; 100*b*; 100*c*; 100*d*; 100*e*) according to a seventeenth aspect further includes, in any one of the first to sixteenth aspects, an external connection terminal (80). The external connection terminal (80) is disposed on the second main surface (92) of the mounting substrate (9).

The radio frequency module (100; 100*a*; 100*b*; 100*c*; 100*d*; 100*e*) according to the seventeenth aspect can easily dissipate the heat generated in the first electronic component (1) and the second electronic component (2) through the shield layer (6).

A communication device (300) according to an eighteenth aspect includes the radio frequency module (100; 100*a*; 100*b*; 100*c*; 100*d*; 100*e*) according to any one of the first to seventeenth aspects; and a signal processing circuit (301). The signal processing circuit (301) is connected to the radio frequency module (100; 100*a*; 100*b*; 100*c*; 100*d*; 100*e*) and performs signal processing on a radio frequency signal.

The communication device (300) according to the eighteenth aspect can improve the heat dissipation.

100, 100*a*, 100*b*, 100*c*, 100*d*, 100*e* RADIO FREQUENCY MODULE
1 FIRST ELECTRONIC COMPONENT
10 FIRST SUBSTRATE
11 FIRST MAIN SURFACE
12 SECOND MAIN SURFACE
13 OUTER PERIPHERAL SURFACE
14 FIRST CIRCUIT SECTION
15 IDT ELECTRODE
16 FIRST PAD ELECTRODE
17 FIRST SPACER LAYER
18 FIRST COVER MEMBER
19 FIRST TERMINAL
193 LOW-ACOUSTIC-VELOCITY FILM
194 PIEZOELECTRIC LAYER
195 INSULATING LAYER
2 SECOND ELECTRONIC COMPONENT
20 SECOND SUBSTRATE
21 FIRST MAIN SURFACE
22 SECOND MAIN SURFACE
23 OUTER PERIPHERAL SURFACE
24 SECOND CIRCUIT SECTION
25 IDT ELECTRODE
26 SECOND PAD ELECTRODE
27 SECOND SPACER LAYER
28 SECOND COVER MEMBER
29 SECOND TERMINAL
200 SOI SUBSTRATE
201 INSULATING LAYER
202 SILICON LAYER
203 MULTILAYER STRUCTURE PORTION
3 THIRD ELECTRONIC COMPONENT
30 THIRD SUBSTRATE
31 FIRST MAIN SURFACE
32 SECOND MAIN SURFACE
33 OUTER PERIPHERAL SURFACE
34 THIRD CIRCUIT SECTION
35 IDT ELECTRODE
39 THIRD TERMINAL
393 LOW-ACOUSTIC-VELOCITY FILM
394 PIEZOELECTRIC LAYER

395 INSULATING LAYER
4 FOURTH ELECTRONIC COMPONENT
40 FOURTH SUBSTRATE
41 FIRST MAIN SURFACE
42 SECOND MAIN SURFACE
43 OUTER PERIPHERAL SURFACE
44 FOURTH CIRCUIT SECTION
46 FOURTH PAD ELECTRODE
403 MULTILAYER STRUCTURE PORTION
5 RESIN LAYER
51 MAIN SURFACE
53 OUTER PERIPHERAL SURFACE
6 SHIELD LAYER
60 RECOGNITION MARK
61 FIRST PORTION
62 SECOND PORTION
63 THIRD PORTION
7 RESIN LAYER
71 MAIN SURFACE
73 OUTER PERIPHERAL SURFACE
8 ELECTRONIC COMPONENT
801 FIRST MAIN SURFACE
802 SECOND MAIN SURFACE
803 OUTER PERIPHERAL SURFACE
9 MOUNTING SUBSTRATE
91 FIRST MAIN SURFACE
92 SECOND MAIN SURFACE
93 OUTER PERIPHERAL SURFACE
80 EXTERNAL CONNECTION TERMINAL
81 ANTENNA TERMINAL
82 SIGNAL INPUT TERMINAL
83 SIGNAL OUTPUT TERMINAL
84 CONTROL TERMINAL
85 GROUND TERMINAL
101 FIRST BUMP
102 SECOND BUMP
103 THIRD BUMP
144 FOURTH BUMP
104 FIRST SWITCH
140 COMMON TERMINAL
141, 142 SELECTION TERMINAL
105 SECOND SWITCH
150 COMMON TERMINAL
151, 152 SELECTION TERMINAL
106 THIRD SWITCH
160 COMMON TERMINAL
161, 162 SELECTION TERMINAL
111 POWER AMPLIFIER
112A, 112B TRANSMISSION FILTER
113 OUTPUT MATCHING CIRCUIT
115 CONTROLLER
121 LOW-NOISE AMPLIFIER
122A, 122B RECEPTION FILTER
123 INPUT MATCHING CIRCUIT
132A DUPLEXER
132B DUPLEXER
171 FIRST FILTER CHIP
173 FIRST PACKAGE SUBSTRATE
1730 FIRST SUPPORT BODY
1731 FIRST MAIN SURFACE
1732 SECOND MAIN SURFACE
1733 ELECTRODE
1734 EXTERNAL CONNECTION ELECTRODE
1735 THROUGH-ELECTRODE
174 BUMP
175 FIRST SEALING RESIN PORTION
180 FIRST BAW RESONATOR
181 FIRST ELECTRODE
182 PIEZOELECTRIC FILM
183 SECOND ELECTRODE
184 CAVITY
185 ELECTRICALLY INSULATING FILM
271 SECOND FILTER CHIP
273 SECOND PACKAGE SUBSTRATE
2730 SECOND SUPPORT BODY
2731 FIRST MAIN SURFACE
2732 SECOND MAIN SURFACE
2733 ELECTRODE
2734 EXTERNAL CONNECTION ELECTRODE
2735 THROUGH-ELECTRODE
274 BUMP
275 SECOND SEALING RESIN PORTION
280 SECOND BAW RESONATOR
281 FIRST ELECTRODE
282 PIEZOELECTRIC FILM
283 SECOND ELECTRODE
284 CAVITY
285 ELECTRICALLY INSULATING FILM
300 COMMUNICATION DEVICE
301 SIGNAL PROCESSING CIRCUIT
302 RF SIGNAL PROCESSING CIRCUIT
303 BASEBAND SIGNAL PROCESSING CIRCUIT
310 ANTENNA
A1 ACOUSTIC REFLECTION LAYER
A11 LOW-ACOUSTIC-IMPEDANCE LAYER
A12 HIGH-ACOUSTIC-IMPEDANCE LAYER
A2 ACOUSTIC REFLECTION LAYER
A21 LOW-ACOUSTIC-IMPEDANCE LAYER
A22 HIGH-ACOUSTIC-IMPEDANCE LAYER
D1 THICKNESS DIRECTION
S1 FIRST SPACE
S2 SECOND SPACE
SP1 FIRST SPACE
SP2 SECOND SPACE
SP3 THIRD SPACE
SP4 FOURTH SPACE

The invention claimed is:
1. A radio frequency module comprising:
a mounting substrate having a first main surface and a second main surface, the first main surface and the second main surface of the mounting substrate being opposed to each other;
a first electronic component and a second electronic component disposed over the first main surface of the mounting substrate;
a resin layer disposed on the first main surface of the mounting substrate and covering an outer peripheral surface of the first electronic component and an outer peripheral surface of the second electronic component; and
a shield layer covering the resin layer, and the first electronic component and the second electronic component,
wherein the first electronic component includes
a first substrate having a first main surface and a second main surface, the first main surface and the second main surface of the first substrate being opposed to each other, and
a first circuit section provided on the first main surface side of the first substrate,
the second electronic component includes
a second substrate having a first main surface and a second main surface, the first main surface and the second main surface of the second substrate being opposed to each other, and a second circuit section provided on the first main surface side of the second substrate, a material of the first substrate and a material of the second substrate are the same, and the shield layer is in contact with the second main surface of the first substrate and the second main surface of the second substrate.

2. The radio frequency module according to claim 1, wherein each of the first electronic component and the second electronic component is an acoustic wave filter, and each of the first substrate and the second substrate is a lithium niobate substrate or a lithium tantalate substrate.

3. The radio frequency module according to claim 1, wherein each of the first electronic component and the second electronic component is an acoustic wave filter, and each of the first substrate and the second substrate is a silicon substrate.

4. The radio frequency module according to claim 1, wherein each of the first electronic component and the second electronic component is an acoustic wave filter of a bare chip.

5. The radio frequency module according to claim 2, wherein the acoustic wave filter constituting the first electronic component is a transmission filter constituting a duplexer, and the acoustic wave filter constituting the second electronic component is a reception filter constituting the duplexer.

6. The radio frequency module according to claim 1, wherein each of the first substrate and the second substrate is a silicon substrate.

7. The radio frequency module according to claim 6, wherein the first electronic component is an acoustic wave filter, and the second electronic component is an IC chip.

8. The radio frequency module according to claim 7, wherein the IC chip includes a power amplifier.

9. The radio frequency module according to claim 7, wherein the IC chip is a controller configured to control a power amplifier.

10. The radio frequency module according to claim 7, wherein the IC chip includes a low-noise amplifier.

11. The radio frequency module according to claim 7, wherein the IC chip includes a switch.

12. The radio frequency module according to claim 7, wherein the IC chip includes a through-electrode penetrating the second substrate in a thickness direction of the second substrate.

13. The radio frequency module according to claim 1, further comprising:

another electronic component disposed over the first main surface of the mounting substrate and covered with the resin layer, wherein a maximum roughness in height of each of the second main surface of the first substrate and the second main surface of the second substrate is larger than a maximum roughness in height of a main surface, on a side opposite to the mounting substrate side, of the other electronic component covered with the resin layer.

14. The radio frequency module according to claim 1, wherein the shield layer has a recognition mark, and the recognition mark includes a first portion of the shield layer overlapping the second main surface of the first substrate in a thickness direction of the mounting substrate, and a second portion of the shield layer overlapping the second main surface of the second substrate in the thickness direction of the mounting substrate.

15. The radio frequency module according to claim 1, further comprising:

a third electronic component disposed over the second main surface of the mounting substrate.

16. The radio frequency module according to claim 15, further comprising:

a fourth electronic component disposed over the second main surface of the mounting substrate, wherein the third electronic component includes a third substrate having a first main surface and a second main surface, the first main surface and the second main surface of the third substrate being opposed to each other, and a third circuit section provided on the first main surface side of the third substrate, the fourth electronic component includes a fourth substrate having a first main surface and a second main surface, the first main surface and the second main surface of the fourth substrate being opposed to each other, and a fourth circuit section provided on the first main surface side of the fourth substrate, at least a part of each of the second main surface of the third substrate and the second main surface of the fourth substrate is exposed, and a material of the third substrate and a material of the fourth substrate are the same.

17. The radio frequency module according to claim 1, further comprising:

an external connection terminal disposed on the second main surface of the mounting substrate.

18. A communication device comprising:

the radio frequency module according to claim 1; and a signal processing circuit connected to the radio frequency module and configured to perform signal processing on a radio frequency signal.

19. The radio frequency module according to claim 3, wherein the acoustic wave filter constituting the first electronic component is a transmission filter constituting a duplexer, and the acoustic wave filter constituting the second electronic component is a reception filter constituting the duplexer.

20. The radio frequency module according to claim 4, wherein the acoustic wave filter constituting the first electronic component is a transmission filter constituting a duplexer, and the acoustic wave filter constituting the second electronic component is a reception filter constituting the duplexer.

* * * * *